(12) United States Patent
Kitajima

(10) Patent No.: US 11,169,307 B2
(45) Date of Patent: Nov. 9, 2021

(54) COMPOSITION, FILM FORMING METHOD, METHOD OF MANUFACTURING NEAR INFRARED CUT FILTER, METHOD OF MANUFACTURING SOLID IMAGE PICKUP ELEMENT, METHOD OF MANUFACTURING IMAGE DISPLAY DEVICE, AND METHOD OF MANUFACTURING INFRARED SENSOR

(71) Applicant: FUJIFILM Corporation, Tokyo (JP)

(72) Inventor: Shunsuke Kitajima, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 383 days.

(21) Appl. No.: 16/235,840

(22) Filed: Dec. 28, 2018

(65) Prior Publication Data
US 2019/0137671 A1 May 9, 2019

Related U.S. Application Data

(63) Continuation of application No. PCT/JP2017/029339, filed on Aug. 15, 2017.

(30) Foreign Application Priority Data

Sep. 12, 2016 (JP) .............................. JP2016-177685

(51) Int. Cl.
*G02B 5/20* (2006.01)
*G02B 5/22* (2006.01)
(Continued)

(52) U.S. Cl.
CPC ............... *G02B 5/223* (2013.01); *G02B 5/22* (2013.01); *G02B 5/281* (2013.01); *G03F 7/0007* (2013.01);
(Continued)

(58) Field of Classification Search
CPC .... G03F 7/0007; G03F 7/0046; G03F 7/0048; G03F 7/027; G03F 7/033; G03F 7/0388;
(Continued)

(56) References Cited

U.S. PATENT DOCUMENTS

2005/0181301 A1* 8/2005 Matsumura ............. G03F 7/027
430/270.1
2011/0281086 A1* 11/2011 Kobayashi ............. C09D 11/36
428/195.1
(Continued)

FOREIGN PATENT DOCUMENTS

JP 2008-138194 A 6/2008
JP 2009-57504 A 3/2009
(Continued)

OTHER PUBLICATIONS

"UV-Reactive Surface Modifiers: MEGAFACE RS Series" by DIC Corporation, printed from internet Apr. 9, 2021. (Year: 2021).*
(Continued)

*Primary Examiner* — John A McPherson
(74) *Attorney, Agent, or Firm* — Birch, Stewart, Kolasch & Birch, LLP

(57) ABSTRACT

A composition includes: a near infrared absorbing compound A that includes a π-conjugated plane having a monocyclic or fused aromatic ring; and a solvent B, in which the solvent B includes a solvent B1 in which a solubility parameter is in a range between 19.9 MPa$^{0.5}$ or higher and 22.3 MPa$^{0.5}$ or lower and a solvent B2 in which a solubility parameter is lower than 19.9 MPa$^{0.5}$ or higher than 22.3 MPa$^{0.5}$, and a content of the solvent B2 in the solvent B is 9 mass % or lower.

22 Claims, 1 Drawing Sheet

(51) Int. Cl.
  *G03F 7/00* (2006.01)
  *H01L 27/146* (2006.01)
  *G03F 7/038* (2006.01)
  *G03F 7/033* (2006.01)
  *G03F 7/004* (2006.01)
  *G03F 7/027* (2006.01)
  *G02B 5/28* (2006.01)
  *H01L 27/148* (2006.01)

(52) U.S. Cl.
  CPC .......... *G03F 7/0046* (2013.01); *G03F 7/0048* (2013.01); *G03F 7/027* (2013.01); *G03F 7/0275* (2013.01); *G03F 7/033* (2013.01); *G03F 7/0388* (2013.01); *H01L 27/148* (2013.01); *H01L 27/14621* (2013.01); *H01L 27/14649* (2013.01)

(58) Field of Classification Search
  CPC ... G02B 5/208; G02B 5/223; H01L 17/14621; H01L 27/14649; H01L 27/14621
  USPC .................................................. 430/7, 281.1
  See application file for complete search history.

(56) References Cited

U.S. PATENT DOCUMENTS

| | | | |
|---|---|---|---|
| 2012/0119171 A1* | 5/2012 | Ohashi | C09B 23/0033 252/587 |
| 2016/0091643 A1* | 3/2016 | Arayama | H01L 27/14618 359/350 |
| 2016/0178818 A1 | 6/2016 | Kawanami | |
| 2017/0351014 A1 | 12/2017 | Matsumura et al. | |

FOREIGN PATENT DOCUMENTS

| | | |
|---|---|---|
| JP | 2014-149506 A | 8/2014 |
| JP | 2015-11095 A | 1/2015 |
| JP | 2015-17244 A | 1/2015 |
| JP | 2015-200881 A | 11/2015 |
| JP | 2015-227466 A | 12/2015 |
| JP | 2016-20496 A | 2/2016 |
| WO | WO 2016/136784 A1 | 9/2016 |

OTHER PUBLICATIONS

International Preliminary Report on Patentability and Written Opinion of the International Searching Authority (forms PCT/IB/373, PCT/ISA/237 and PCT/IB/326), dated Mar. 21, 2019, for corresponding International Application No. PCT/JP2017/029339, with a Written Opinion translation.

International Search Report (form PCT/ISA/210), dated Oct. 10, 2017, for corresponding International Application No. PCT/JP2017/029339, with an English translation.

Author Unknown, "Irgacure OXE01", URL: https://www.tenkazai.com/product-basf/irgacureoxe01.html, Nov. 6, 2019, 2 pages.

Author Unknown, "EHPE3150 Multi-functional Cycloaliphatic Epoxy Resin", Daicel Corporation Organic Chemical Products Company, PDS (Product Data Sheet) Document No. 20140310, 2014, 1 page.

Author Unknown, "Kayarad Kayamer Kayacure Radiation Curable Products", Nippon Kayaku Co. Ltd, Dec. 2016, pp. 7-8 (2 pages).

Author Unknown, "Pyromellitic Dianhydride 89-32-7", URL: www.tcichemicals.com/eshop/ja/jp/commodity/B0040/, Nov. 6, 2019, pp. 1-2 (2 pages).

Author Unknown, "UV reaction type surface modifier", DIC Corporation, URL: http://www.dic-global/ja/products/additive/flouro/uv_surfacemodifiers.html, Nov. 5, 2019, 3 pages.

Japanese Office Action, dated Jan. 14, 2020, for corresponding Japanese Application No. 2018-538325, with an English translation.

Taiwanese Office Action and Search Report, dated Dec. 3, 2020, for corresponding Taiwanese Application No. 106128338 with an English translation of the Taiwanese Office Action.

Japanese Office Action, dated Jul. 7, 2020, for Japanese Application No. 2018-538325, with an English translation.

* cited by examiner

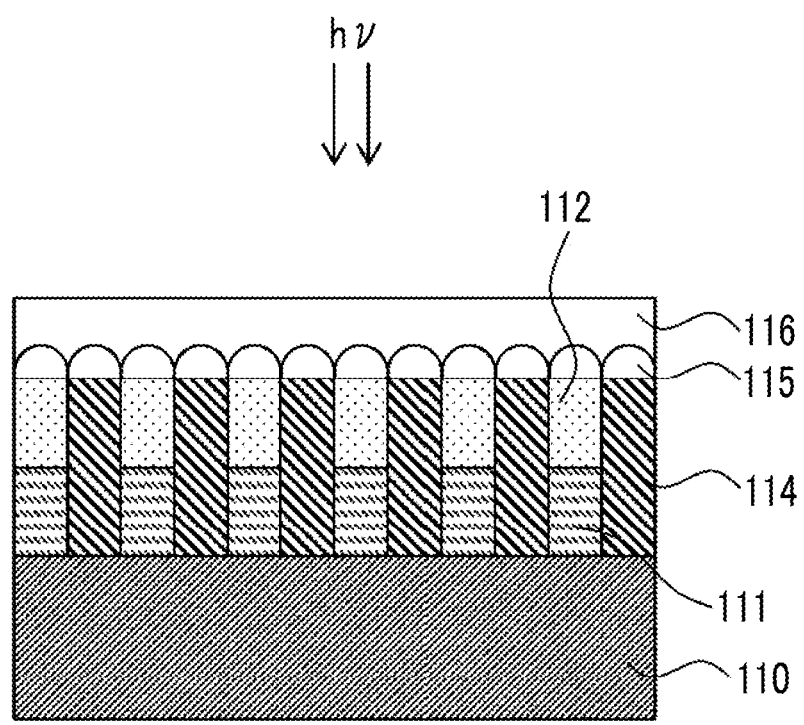

COMPOSITION, FILM FORMING METHOD, METHOD OF MANUFACTURING NEAR INFRARED CUT FILTER, METHOD OF MANUFACTURING SOLID IMAGE PICKUP ELEMENT, METHOD OF MANUFACTURING IMAGE DISPLAY DEVICE, AND METHOD OF MANUFACTURING INFRARED SENSOR

CROSS-REFERENCE TO RELATED APPLICATIONS

This application is a Continuation of PCT International Application No. PCT/JP2017/29339, filed on Aug. 15, 2017, which claims priority under 35 U.S.C. § 119(a) to Japanese Patent Application No. 2016-177685, filed on Sep. 12, 2016. Each of the above application(s) is hereby expressly incorporated by reference, in its entirety, into the present application.

BACKGROUND OF THE INVENTION

1. Field of the Invention

The present invention relates to a composition, a film forming method, a method of manufacturing a near infrared cut filter, a method of manufacturing a solid image pickup element, a method of manufacturing an image display device, and a method of manufacturing an infrared sensor.

2. Description of the Related Art

In a video camera, a digital still camera, a mobile phone with a camera function, or the like, a charge coupled device (CCD) or a complementary metal-oxide semiconductor (CMOS), which is a solid image pickup element for a color image, is used. In a light receiving section of this solid image pickup element, a silicon photodiode having sensitivity to infrared light is used. Therefore, visibility may be corrected using a near infrared cut filter.

JP2015-017244A describes that a near infrared cut filter is manufactured using a curable composition including: a near infrared absorbing colorant; and a curable compound having one or more selected from the group consisting of a fluorine atom, a silicon atom, a linear alkyl group having 8 or more carbon atoms, and a branched alkyl group having 3 or more carbon atoms.

SUMMARY OF THE INVENTION

According to an investigation by the present inventors, it was found that a film having excellent spectral characteristics in a near infrared range can be formed by using a composition that includes a near infrared absorbing compound having a monocyclic or fused aromatic ring. The present inventors further conducted an investigation on the composition including the near infrared absorbing compound, and found that, even in a case where the same composition is used, a variation in spectral characteristics of the obtained film in a near infrared range is likely to occur, and the reason for the occurrence of the variation depends on humidity conditions during application of the composition.

Accordingly, an object of the present invention is to provide a composition with which a film having excellent heat resistance and having a suppressed variation in spectral characteristics in a near infrared range even under different humidity conditions during application can be formed. In addition, another object of the present invention is to provide a film forming method, a method of manufacturing a near infrared cut filter, a method of manufacturing a solid image pickup element, a method of manufacturing an image display device, and a method of manufacturing an infrared sensor.

According to the investigation, the present inventors found that the objects can be achieved using a composition described below, thereby completing the present invention. The present invention provides the following.

<1> A composition comprising:
a near infrared absorbing compound A that includes a t-conjugated plane having a monocyclic or fused aromatic ring; and
a solvent B,
in which the solvent B includes a solvent B1 in which a solubility parameter is in a range between 19.9 $MPa^{0.5}$ or higher and 22.3 $MPa^{0.5}$ or lower and a solvent B2 in which a solubility parameter is lower than 19.9 $MPa^{0.5}$ or higher than 22.3 $MPa^{0.5}$, and
a content of the solvent B2 in the solvent B is 9 mass % or lower.
<2> The composition according to <1>,
in which the solvent B1 is at least one selected from cyclohexanone, cyclopentanone, dipropylene glycol monomethyl ether, or 3-methoxybutanol.
<3> The composition according to <1> or <2>,
in which the solvent B2 is at least one selected from propylene glycol monomethyl ether acetate, propylene glycol monomethyl ether, methylene chloride, ethyl-3-ethoxypropionate, N-methyl-2-pyrrolidone, butyl acetate, or ethyl lactate.
<4> The composition according to any one of <1> to <3>, further comprising:
a surfactant.
<5> The composition according to <4>,
in which the surfactant is a compound having a fluorine atom and a curable group.
<6> The composition according to <4>,
in which the surfactant is a compound having a fluoroether group and a curable group.
<7> The composition according to <4>,
in which the surfactant is a polymer that includes a repeating unit having a fluoroether group and a repeating unit having a curable group.
<8> The composition according to any one of <4> to <7>,
in which a content of the surfactant is 0.1 to 12 mass % with respect to a total solid content of the composition.
<9> The composition according to any one of <1> to <8>, further comprising:
a resin.
<10> The composition according to any one of <1> to <9>, further comprising:
a polymerizable compound; and
a photopolymerization initiator.
<11> A film forming method comprising:
applying the composition according to any one of <1> to <10> to a support.
<12> The film forming method according to <11>, further comprising:
forming a pattern.
<13> A method of manufacturing a near infrared cut filter comprising:
the film forming method according to <11> or <12>.
<14> A method of manufacturing a solid image pickup element comprising:
the film forming method according to <11> or <12>.

<15> A method of manufacturing an image display device comprising:
the film forming method according to <11> or <12>.
<16> A method of manufacturing an infrared sensor comprising:
the film forming method according to <11> or <12>.

According to the present invention, it is possible to provide a composition with which a film having excellent heat resistance and having a suppressed variation in spectral characteristics in a near infrared range even under different humidity conditions during application can be formed. In addition, it is possible to provide a film forming method, a method of manufacturing a near infrared cut filter, a method of manufacturing a solid image pickup element, a method of manufacturing an image display device, and a method of manufacturing an infrared sensor.

BRIEF DESCRIPTION OF THE DRAWINGS

FIG. 1 is a schematic diagram showing an embodiment of an infrared sensor.

DESCRIPTION OF THE PREFERRED EMBODIMENTS

Hereinafter, the details of the present invention will be described.

In this specification, numerical ranges represented by "to" include numerical values before and after "to" as lower limit values and upper limit values.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate or methacrylate, "(meth)acryl" denotes either or both of acryl and methacryl, and "(meth)acryloyl" denotes either or both of acryloyl and methacryloyl.

In this specification, a weight-average molecular weight and a number-average molecular weight are defined as values in terms of polystyrene obtained by gel permeation chromatography (GPC). In this specification, an weight-average molecular weight (Mw) and a number-average molecular weight (Mn) can be obtained by using HLC-8220 (manufactured by Tosoh Corporation), using TSKgel Super AWM-H (manufactured by Tosoh Corporation; 6.0 mm ID (inner diameter)×15.0 cm) as a column, and using a 10 mmol/L lithium bromide N-methylpyrrolidinone (NMP) solution as an eluent.

In this specification, near infrared light denotes light (electromagnetic wave) having an absorption maximum in a wavelength range of 700 to 2500 nm.

In this specification, a total solid content denotes the total mass of all the components of the composition excluding a solvent.

In this specification, the term "step" denotes not only an individual step but also a step which is not clearly distinguishable from another step as long as an effect expected from the step can be achieved.

<Composition>

A composition according to an embodiment of the present invention includes: a near infrared absorbing compound A that includes a n-conjugated plane having a monocyclic or fused aromatic ring; and a solvent B,
in which the solvent B includes a solvent B1 in which a solubility parameter is in a range of 19.9 $MPa^{0.5}$ to 22.3 $MPa^{0.5}$ and a solvent B2 in which a solubility parameter is lower than 19.9 $MPa^{0.5}$ or higher than 22.3 $MPa^{0.5}$, and
a content of the solvent B2 in the solvent B is 9 mass % or lower.

With the composition according to the embodiment of the present invention, a film having excellent heat resistance and having a suppressed variation in spectral characteristics in a near infrared range even under different humidity conditions during application can be formed. The mechanism for the effect is not clear but is presumed to be as follows. First, the reason for the occurrence of a variation in the spectral characteristics of the obtained film in a near infrared range caused by a variation in humidity during application is presumed to be as follows. That is, as the humidity during application increases, the amount of a residual solvent in the film immediately after application increases, the near infrared absorbing compound A is likely to locally aggregate, and a variation is likely to occur in the aggregate size of the near infrared absorbing compound A in the film. As a result, a variation in spectral characteristics in a near infrared range occurs. On the other hand, in the composition according to the embodiment of the present invention, the solvent B includes the solvent B1 in which a solubility parameter is in a range of 19.9 $MPa^{0.5}$ to 22.3 $MPa^{0.5}$ and the solvent B2 in which a solubility parameter is lower than 19.9 $MPa^{0.5}$ or higher than 22.3 $MPa^{0.5}$, and the content of the solvent B2 in the solvent B is 9 mass % or lower. As a result, even in a case where the humidity during application varies, a variation in the aggregate size of the near infrared absorbing compound A is not likely to occur, and thus a film having a suppressed spectral variation can be formed. In addition, since the near infrared absorbing compound A can be made to appropriately aggregate in the film, excellent heat resistance can be obtained.

Hereinafter, each component of the composition according to the embodiment of the present invention will be described.

<<Near Infrared Absorbing Compound A>>

The composition according to the embodiment of the present invention includes a near infrared absorbing compound A that includes a n-conjugated plane having a monocyclic or fused aromatic ring. In this specification, the near infrared absorbing compound refers to a compound having an absorption in a near infrared range (preferably in a wavelength range of 650 to 1000 nm).

The near infrared absorbing compound A includes the t-conjugated plane having a monocyclic or fused aromatic ring. Therefore, due to an interaction between aromatic rings on the t-conjugated plane of the near infrared absorbing compound A, a J-aggregate of the near infrared absorbing compound A is likely to be formed in the film, and a film having excellent spectral characteristics in a near infrared range can be formed. In addition, according to the present invention, it is presumed that a variation in the aggregate size of the near infrared absorbing compound A can be suppressed even under different humidity conditions during application, and a film having excellent heat resistance and having a suppressed spectral variation can be formed.

The near infrared absorbing compound A may be a pigment (also referred to as "near infrared absorbing pigment") or a dye (also referred to as "near infrared absorbing dye") but is preferably a near infrared absorbing dye. In the related art, in a case where the near infrared absorbing dye is used, a variation in the spectral characteristics of the obtained film in a near infrared range tends to be likely to occur under different humidity conditions during application. According to the present invention, even in a case where the near infrared absorbing dye is used, a variation in spectral characteristics in a near infrared range can be effectively suppressed, and heat resistance can be further improved. Therefore, in a case where the near infrared absorbing dye is used as the near infrared absorbing compound A, the effects of the present invention is particularly significant. In the present invention, it is preferable that the near infrared absorbing dye and the near infrared absorbing pigment are used in combination. In a case where the near infrared absorbing dye and the near infrared absorbing pigment are used in combination, a mass ratio near infrared absorbing dye:near infrared absorbing pigment of the near infrared absorbing dye to the near infrared absorbing pigment is preferably 99.9:0.1 to 0.1:99.9, more preferably 99.9:0.1 to 10:90, and still more preferably 99.9:0.1 to 20:80.

A solubility of the near infrared absorbing dye in 100 g of at least one solvent selected from cyclopentanone, cyclohexanone, or dipropylene glycol monomethyl ether at 23° C. is preferably 1 g/100 g solvent or higher, more preferably 2 g/100 g solvent or higher, and still more preferably 5 g/100 g solvent or higher. A solubility of the near infrared absorbing pigment in 100 g of at least one solvent selected from cyclopentanone, cyclohexanone, or dipropylene glycol monomethyl ether at 23° C. is preferably lower than 1 g/100 g solvent, more preferably 0.1 g/100 g solvent or lower, and still more preferably 0.01 g/100 g solvent or lower.

The number of atoms constituting the π-conjugated plane in the near infrared absorbing compound A other than hydrogen is preferably 6 or more and more preferably 14 or more. For example, the upper limit is preferably 50 or less. In a case where the near infrared absorbing compound A includes two or more π-conjugated planes, the total number of atoms constituting the respective π-conjugated planes other than hydrogen is preferably 14 or more and more preferably 20 or more. For example, the upper limit is preferably 80 or less. Even in this case, the total number of atoms constituting one π-conjugated plane other than hydrogen is preferably 6 or more and more preferably 14 or more. For example, the upper limit is preferably 50 or less.

The number of monocyclic or fused aromatic rings in the ii-conjugated plane included in the near infrared absorbing compound A is preferably 2 or more, more preferably 3 or more, still more preferably 4 or more, and even still more preferably 5 or more. The upper limit is preferably 100 or less, more preferably 50 or less, and still more preferably 30 or less.

Examples of the aromatic ring include a benzene ring, a naphthalene ring, a pentalene ring, an indene ring, an azulene ring, a heptalene ring, an indacene ring, a perylene ring, a pentacene ring, a quaterrylene ring, an acenaphthene ring, a phenanthrene ring, an anthracene ring, a naphthacene ring, a chrysene ring, a triphenylene ring, a fluorene ring, a pyridine ring, a quinoline ring, an isoquinoline ring, an imidazole ring, a benzimidazole ring, a pyrazole ring, a thiazole ring, a benzothiazole ring, a triazole ring, a benzotriazole ring, an oxazole ring, a benzoxazole ring, an imidazoline ring, a pyrazine ring, a quinoxaline ring, a pyrimidine ring, a quinazoline ring, a pyridazine ring, a triazine ring, a pyrrole ring, an indole ring, an isoindole ring, a carbazole ring, and a fused ring including the above-described ring.

The near infrared absorbing compound A has an absorption maximum preferably in a wavelength range of 650 to 1000 nm, more preferably in a wavelength range of 660 to 1000 nm, still more preferably in a wavelength range of 670 to 1000 nm, and even still more preferably in a wavelength range of 700 to 1000 nm.

In this specification, "having an absorption maximum in a wavelength range of 650 to 1000 nm" denotes having a maximum absorbance in a wavelength range of 650 to 1000 nm in an absorption spectrum of the near infrared absorbing compound in a solution. Examples of a measurement solvent used for the measurement of the absorption spectra of the near infrared absorbing compound in the solution include chloroform, methanol, dimethyl sulfoxide, ethyl acetate, and tetrahydrofuran. In the case of a compound which is soluble in chloroform, chloroform is used as the measurement solvent. In the case of a compound which is not soluble in chloroform, methanol is used. In addition, In the case of a compound which is not soluble in chloroform and methanol, dimethyl sulfoxide is used.

In the near infrared absorbing compound A, a ratio $A^1/A^2$ of an absorbance $A^1$ at a wavelength of 500 nm to an absorbance $A^2$ at the absorption maximum is preferably 0.08 or lower and more preferably 0.04 or lower. According to this aspect, a film having excellent visible transparency and infrared shielding properties can be easily manufactured. The absorbance $A^1$ at a wavelength of 500 nm and the absorbance $A^2$ at the absorption maximum are values obtained from the absorption spectrum of the near infrared absorbing compound in the solution.

In a case where the near infrared absorbing compound A is a dye, it is preferable that the near infrared absorbing compound A has a hydrophobic group. "Hydrophobic group" refers to a group having low polarity and low affinity to water. In a case where the near infrared absorbing compound A has a hydrophobic group, due to a π-π interaction between the π-conjugated planes and an interaction between hydrophobic groups, the near infrared absorbing compound A is arranged to be obliquely shifted in the film, and a J-aggregate is likely to be formed. In a case where the near infrared absorbing compound A forms a J-aggregate, the absorption maximum of the near infrared absorbing compound A is shifted to a wavelength side longer than that in a state the J-aggregate is not formed. Accordingly, in a case where the absorption maximum of the film including the near infrared absorbing compound A is shifted to a wavelength side longer than the absorption maximum of the near infrared absorbing compound A in the organic solvent, it can be said that the near infrared absorbing compound A forms a J-aggregate in the film. Whether or not the near infrared absorbing compound A forms a J-aggregate can be verified based on, for example, X-ray crystallography data of crystals forming the J-aggregate and X-ray surface analysis of a sample including the near infrared absorbing compound A. The shift amount of the absorption maximum after the formation of the J-aggregate is, for example, preferably 20 nm or longer, more preferably 30 nm or longer, and still more preferably 40 nm or longer. The upper limit is not particularly limited and is, for example, 200 nm or shorter or 180 nm or shorter.

In the present invention, it is preferable that the hydrophobic group is a group represented by Formula (W).

-L-T     (W)

In Formula (W), L represents a single bond, a divalent linking group represented by any one of the following Formulae (L-1) to (L-18), or a divalent linking group obtained by bonding two or more selected from the divalent linking groups represented by the following Formulae (L-1) to (L-18).

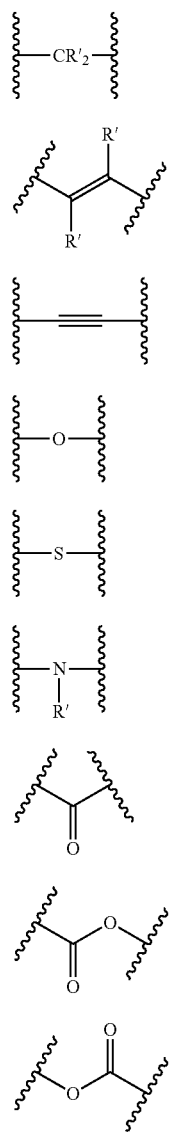

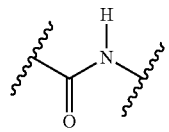

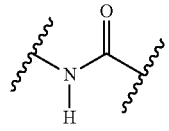

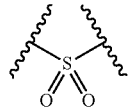

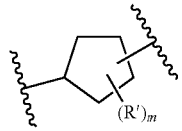

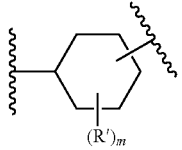

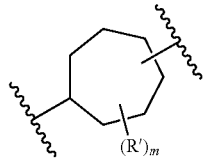

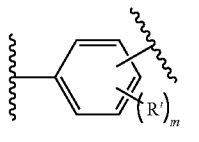

In the formulae, a wave line portion represents a binding site, R' represents a substituent, and m represents an integer of 0 or more.

The upper limit of m represents the maximum number of substituents in each group. It is preferable that m represents 0.

Examples of the substituent represented by R' include a halogen atom, a cyano group, a nitro group, an alkyl group, an alkenyl group, an alkynyl group, an aryl group, a heteroaryl group, an aralkyl group, an alkoxy group, an aryloxy group, a heteroaryloxy group, an alkylthio (alkylsulfanyl) group, an arylthio group, a heteroarylthio group, $—NR^1R^2$, $—COR^3$, $—COOR^4$, $—OCOR^5$, $—NHCOR^6$, $—CONR^7R^8$, $—NHCONR^9R^{10}$, $—NHCOOR^{11}$, $—SO_2R^{12}$, $—SO_2OR^{13}$, $—NHSO_2R^{14}$, and $—SO_2NR^{15}R^{16}$. $R^1$ to $R^{16}$ each independently represent a hydrogen atom, an alkyl group, an alkenyl group, an alkynyl group, an aryl group, or a heteroaryl group.

Examples of the halogen atom include a fluorine atom, a chlorine atom, a bromine atom, and an iodine atom.

The number of carbon atoms in the alkyl group, the alkoxy group, and the alkylthio group is preferably 1 to 20, more preferably 1 to 15, and still more preferably 1 to 8. The alkyl group, the alkoxy group, and the alkylthio group may be linear, branched, or cyclic and is preferably linear or branched and more preferably branched.

The number of carbon atoms in the alkenyl group is preferably 2 to 20, more preferably 2 to 12, and still more preferably 2 to 8. The alkenyl group may be linear, branched, or cyclic and is preferably linear or branched.

The number of carbon atoms in the aryl group is preferably 6 to 30, more preferably 6 to 20, and still more preferably 6 to 12.

The number of carbon atoms in the alkynyl group is preferably 2 to 40, more preferably 2 to 30, and still more preferably 2 to 25. The alkynyl group may be linear, branched, or cyclic and is preferably linear or branched.

The number of carbon atoms in the aryl group included in the aryloxy group and the arylthio group is preferably 6 to 30, more preferably 6 to 20, and still more preferably 6 to 12.

The number of carbon atoms in the aralkyl group is preferably 7 to 40, more preferably 7 to 30, and still more preferably 7 to 25.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5-membered or 6-membered ring.

Examples of the heteroaryl group included in the heteroaryloxy group and the heteroarylthio group are as described above, and preferable ranges thereof are also the same.

In Formula (W), T represents an alkyl group, a cyano group, a formyl group, a boryl group, a vinyl group, an ethynyl group, an aryl group, or a heteroaryl group.

The number of carbon atoms in the alkyl group represented by T is preferably 2 to 40. The lower limit is more preferably 5 or more, still more preferably 8 or more, and even still more preferably 10 or more. The upper limit is more preferably 32 or less and still more preferably 28 or less. The alkyl group may be linear, branched, or cyclic and is preferably linear or branched and more preferably branched.

The number of carbon atoms in the aryl group represented by T is preferably 6 to 30, more preferably 6 to 20, and still more preferably 6 to 12.

The heteroaryl group represented by T may be monocyclic or polycyclic. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. The number of carbon atoms constituting the ring of the heteroaryl group is preferably 3 to 30, more preferably 3 to 18, and still more preferably 3 to 12.

As T, an alkyl group is more preferable.

As the near infrared absorbing compound A, at least two compounds having different absorption maximums are preferably used. According to this aspect, the waveform of the absorption spectrum of the film is wider than that in a case where one near infrared absorbing compound is used, and the film can shield near infrared light in a wide wavelength range. In a case where at least two compounds having different absorption maximums are used, it is preferable that the two or more compounds include at least the first near infrared absorbing compound having an absorption maximum in a wavelength range of 650 to 1000 nm, and the second near infrared absorbing compound having an absorption maximum in a wavelength range of 650 to 1000 nm which is shorter than the absorption maximum of the first near infrared absorbing compound. A difference between the absorption maximum of the first near infrared absorbing compound and the absorption maximum of the second near infrared absorbing compound is 1 to 150 nm.

As the near infrared absorbing compound A, at least one selected from a pyrrolopyrrole compound, a cyanine compound, a squarylium compound, a phthalocyanine compound, a naphthalocyanine compound, a quaterrylene compound, a merocyanine compound, a croconium compound, an oxonol compound, a diimmonium compound, a dithiol compound, a triarylmethane compound, a pyrromethene compound, an azomethine compound, an anthraquinone compound, or a dibenzofuranone compound is preferable, at least one selected from a pyrrolopyrrole compound, a cyanine compound, a squarylium compound, a phthalocyanine compound, a naphthalocyanine compound, or a quaterrylene compound is more preferable, at least one selected from a pyrrolopyrrole compound, a cyanine compound, or a squarylium compound is still more preferable, and a pyrrolopyrrole compound is even still more preferable. Examples of the diimmonium compound include a compound described in JP2008-528706A, the content of which is incorporated herein by reference. Examples of the phthalocyanine compound include a compound described in paragraph "0093" of JP2012-077153A, oxytitaniumphthalocyanine described in JP2006-343631A, and a compound described in paragraphs "0013" to "0029" of JP2013-195480A, the contents of which are incorporated herein by reference. Examples of the naphthalocyanine compound include a compound described in paragraph "0093" of JP2012-077153A, the content of which is incorporated herein by reference. As the cyanine compound, the phthalocyanine compound, the naphthalocyanine compound, the diimmonium compound, or the squarylium compound, for example, a compound described in paragraphs "0010" to "0081" of JP2010-111750A may be used, the content of which is incorporated in this specification. In addition, the details of the cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference.

As the pyrrolopyrrole compound, a compound represented by the following Formula (PP) is preferable. According to this aspect, a film having excellent heat resistance and light fastness can be easily obtained.

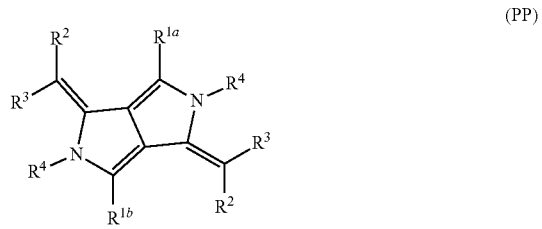

(PP)

In the formula, $R^{1a}$ and $R^{1b}$ each independently represent an alkyl group, an aryl group, or a heteroaryl group, $R^2$ and $R^3$ each independently represent a hydrogen atom or a substituent, and $R^2$ and $R^3$ may be bonded to each other to form a ring. $R^4$'s each independently represent a hydrogen atom, an alkyl group, an aryl group, a heteroaryl group, $-BR^{4A}R^{4B}$, or a metal atom, $R^4$ may form a covalent bond or a coordinate bond with at least one selected from $R^{1a}$, $R^{1b}$, or $R^3$, and $R^{4A}$ and $R^{4B}$ each independently represent a substituent. The details of Formula (PP) can be found in paragraphs "0017" to "0047" of JP2009-263614A, paragraphs "0011" to "0036" of JP2011-068731A, and paragraphs "0010" to "0024" of WO2015/166873A, the contents of which are incorporated herein by reference.

$R^{1a}$ and $R^{1b}$ each independently represent preferably an aryl group or a heteroaryl group, and more preferably an aryl group. The alkyl group, the aryl group, and the heteroaryl group represented by $R^{1a}$ to $R^{1b}$ may have a substituent or may be unsubstituted. Examples of the substituent include substituents described in paragraphs "0020" to "0022" of 2009-263614A. Among these, an alkoxy group or a hydroxy group is preferable. The alkoxy group is preferably an alkoxy group having a branched alkyl group. The group represented by $R^{1a}$ and $R^{1b}$ is preferably an aryl group which has an alkoxy group having a branched alkyl group as a substituent, or an aryl group which has a hydroxy group as a substituent. The number of carbon atoms in the branched alkyl group is preferably 3 to 30 and more preferably 3 to 20.

It is preferable that at least one of $R^2$ or $R^3$ represents an electron-withdrawing group, and it is more preferable that $R^2$ represents an electron-withdrawing group (preferably a cyano group) and $R^3$ represents a heteroaryl group. It is preferable that the heteroaryl group is a 5-membered or 6-membered ring. The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. It is preferable that the heteroaryl group has one or more nitrogen atoms.

It is preferable that $R^4$ represents a hydrogen atom or a group represented by $-BR^{4A}R^{4B}$ As the substituent represented by $R^{4A}$ and $R^{4B}$, a halogen atom, an alkyl group, an alkoxy group, an aryl group, or a heteroaryl group is preferable, an alkyl group, an aryl group, or a heteroaryl group is more preferable, and an aryl group is still more preferable. Specific examples of the group represented by $-BR^{4A}R^{4B}$ include a difluoroboron group, a diphenylboron group, a dibutylboron group, a dinaphthylboron group, and a catecholboron group. In particular, a diphenylboron group is preferable.

Specific examples of the pyrrolopyrrole compound include the following compounds. In the following structural formulae, Me represents a methyl group, Bu represents a butyl group, and Ph represents a phenyl group. In addition, examples of the pyrrolopyrrole compound include a compound described in paragraphs "0016" to "0058" of JP2009-263614A, a compound described in paragraphs "0037" to "0052" of JP2011-068731A, and a compound described in paragraphs "0010" to "0033" of WO2015/166873A, the contents of which are incorporated herein by reference.

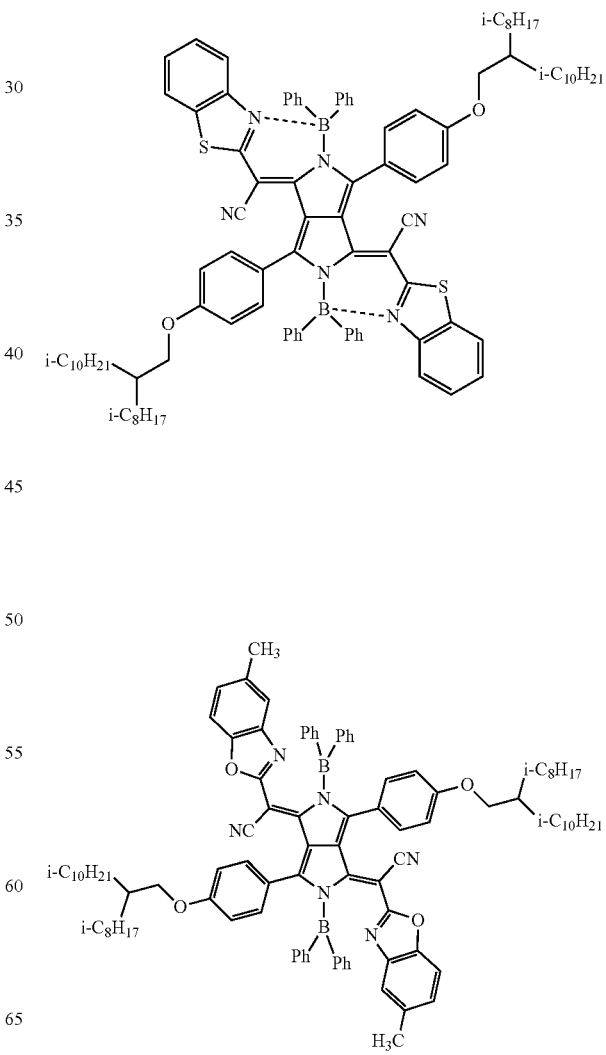

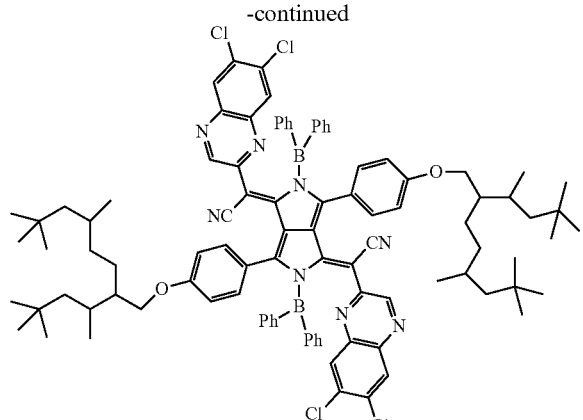

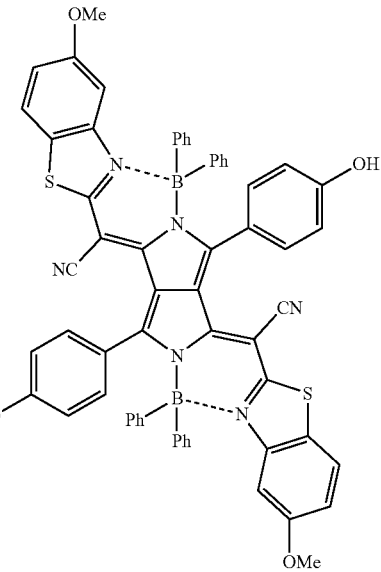

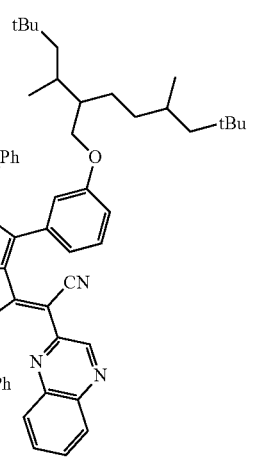

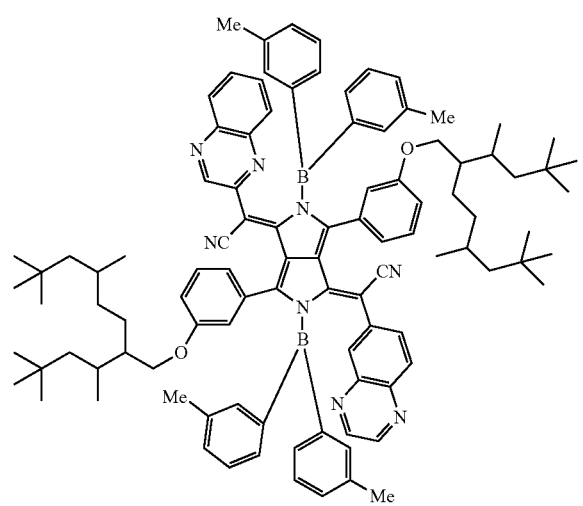

As the squarylium compound, a compound represented by the following Formula (SQ) is preferable.

(SQ)

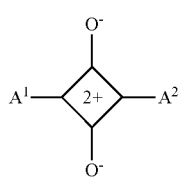

In Formula (SQ), $A^1$ and $A^2$ each independently represent an aryl group, a heteroaryl group, or a group represented by the following Formula (A-1).

(A-1)

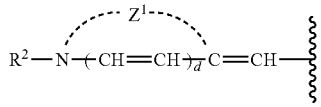

In Formula (A-1), $Z^1$ represents a non-metal atomic group for forming a nitrogen-containing heterocycle, $R^2$ represents an alkyl group, an alkenyl group, or an aralkyl group, d represents 0 or 1, and a wave line represents a direct bond.

The details of Formula (SQ) can be found in paragraphs "0020" to "0049" of JP2011-208101A, the content of which is incorporated herein by reference.

As shown below, cations in Formula (SQ) are present without being localized.

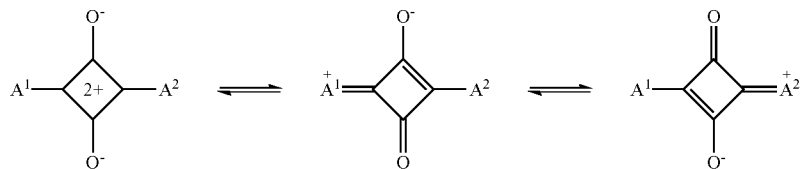

Specific examples of the squarylium compound include the following compounds. Examples of the squarylium compound include a compound described in paragraphs "0044" to "0049" of JP2011-208101A, the content of which is incorporated herein by reference.

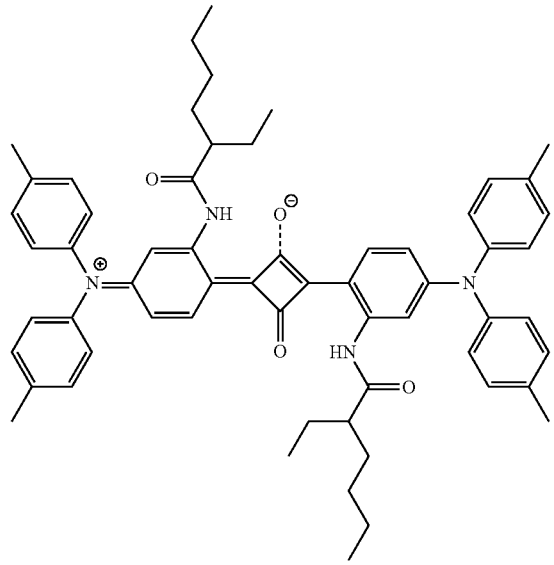

As the cyanine compound, a compound represented by Formula (C) is preferable.

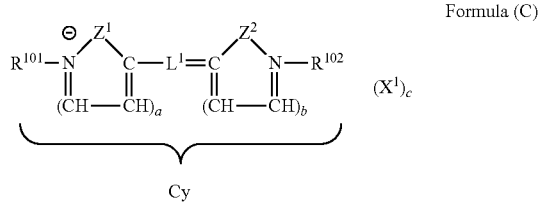

Formula (C)

In the formula, $Z^1$ and $Z^2$ each independently represent a non-metal atomic group for forming a 5- or 6-membered nitrogen-containing heterocycle which may be fused.

$R^{101}$ and $R^{102}$ each independently represent an alkyl group, an alkenyl group, an alkynyl group, an aralkyl group, or an aryl group.

$L^1$ represents a methine chain including an odd number of methine groups.

a and b each independently represent 0 or 1.

In a case where a represents 0, a carbon atom and a nitrogen atom are bonded through a double bond. In a case where b represents 0, a carbon atom and a nitrogen atom are bonded through a single bond.

In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

Specific examples of the cyanine compound include the following compounds. In addition, examples of the cyanine compound include a compound described in paragraphs "0044" and "0045" of JP2009-108267A, a compound described in paragraphs "0026" to "0030" of JP2002-194040A, a compound described in JP2015-172004A, and a compound described in JP2015-172102A, the contents of which are incorporated herein by reference.

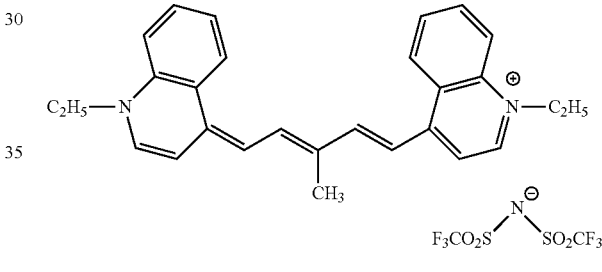

In the composition according to the embodiment of the present invention, the content of the near infrared absorbing compound A is preferably 0.01 to 50 mass % with respect to the total solid content of the composition. The upper limit is more preferably 40 mass % or lower, still more preferably 30 mass % or lower, and even still more preferably 15 mass % or lower. The lower limit is more preferably 0.1 mass % or higher, still more preferably 0.5 mass % or higher, even still more preferably 1 mass % or higher, even yet still more preferably 5 mass % or higher, and most preferably 10 mass % or higher. As the near infrared absorbing compound A, one kind may be used alone, or two or more kinds may be used. In a case where two or more near infrared absorbing compounds A are used in combination, it is preferable that the total content of the two or more near infrared absorbing compounds A is in the above-described range.

<<Other Near Infrared Absorbing Compounds>>

The composition according to the embodiment of the present invention may further include near infrared absorbing compounds (also referred to as "other near infrared absorbing compounds) other than the near infrared absorbing compound A. Examples of the other near infrared absorbing compounds include an inorganic pigment (inorganic particles). As the inorganic pigment, metal oxide particles or metal particles are preferable from the viewpoint of further improving infrared shielding properties. Examples of the metal oxide particles include indium tin oxide (ITO)

particles, antimony tin oxide (ATO) particles, zinc oxide (ZnO) particles, Al-doped zinc oxide (Al-doped ZnO) particles, fluorine-doped tin dioxide (F-doped $SnO_2$) particles, and niobium-doped titanium dioxide (Nb-doped $TiO_2$) particles. Examples of the metal particles include silver (Ag) particles, gold (Au) particles, copper (Cu) particles, and nickel (Ni) particles. As the inorganic pigment, a tungsten oxide compound can also be used. As the tungsten oxide compound, cesium tungsten oxide is preferable. The details of the tungsten oxide compound can be found in paragraph "0080" of JP2016-006476A, the content of which is incorporated herein by reference. The shape of the inorganic pigment is not particularly limited and may have a sheet shape, a wire shape, or a tube shape irrespective of whether or not the shape is spherical or non-spherical.

In a case where the composition according to the embodiment of the present invention includes the other near infrared absorbing compounds, the content of the other near infrared absorbing compounds is preferably 0.01 to 50 mass % with respect to the total solid content of the composition. The lower limit is more preferably 0.1 mass % or higher and still more preferably 0.5 mass % or higher. The upper limit is more preferably 30 mass % or lower, and still more preferably 15 mass % or lower.

The total content of the near infrared absorbing compound A and the other near infrared absorbing compounds is preferably 0.01 to 50 mass % with respect to the total solid content of the composition according to the embodiment of the present invention. The lower limit is more preferably 0.1 mass % or higher and still more preferably 0.5 mass % or higher. The upper limit is more preferably 40 mass % or lower, still more preferably 30 mass % or lower, and even still more preferably 15 mass % or lower.

The content of the other near infrared absorbing compounds is preferably 1 to 99 mass % with respect to the total mass of the near infrared absorbing compound A and the other near infrared absorbing compounds. The upper limit is preferably 80 mass % or lower, more preferably 50 mass % or lower, and still more preferably 30 mass % or lower.

In the composition according to the embodiment of the present invention, it is preferable that the content of the near infrared absorbing compound A is higher than that of the other near infrared absorbing compounds. It is also preferable that the composition according to the embodiment of the present invention does not substantially include the other near infrared absorbing compounds. Substantially not including the other near infrared absorbing compounds represents that the content of the other near infrared absorbing compound is preferably 0.5 mass % or lower, more preferably 0.1 mass % or lower, and still more preferably 0 mass % with respect to the total mass of the near infrared absorbing compound A and the other near infrared absorbing compounds.

<<Solvent B>>

The composition according to the embodiment of the present invention includes the solvent B. The solvent B includes the solvent B1 in which the solubility parameter (solubility parameter (SP value)) is in a range of 19.9 $MPa^{0.5}$ to 22.3 $MPa^{0.5}$ and the solvent B2 in which the solubility parameter is lower than 19.9 $MPa^{0.5}$ or higher than 22.3 $MPa^{0.5}$. In this specification, as the value of the solubility parameter of the solvent, a Hansen solubility parameter is used. The details of the Hansen solubility parameter can be found in Charles M. Hansen:Hansen Solubility Parameters:A User's Handbook, Second Edition. However, in a case where there are any special circumstances under which the solubility parameter cannot be measured using the method described in this document, the solubility parameter may be measured using other methods.

The solubility parameter of the solvent B1 is preferably 19.9 $MPa^{0.5}$ to 22.3 $MPa^{0.5}$, more preferably 19.9 $MPa^{0.5}$ to 22.0 $MPa^{0.5}$, and still more preferably 19.9 $MPa^{0.5}$ to 21.6 $MPa^{0.5}$.

An absolute value (Solubility Parameter of Solvent B1-Solubility Parameter of Solvent B2) of a difference between the solubility parameter of the solvent B1 and the solubility parameter of the solvent B2 is preferably 0.1 $MPa^{0.5}$ to 6.0 $MPa^{0.5}$, more preferably 0.1 $MPa^{0.5}$ to 4.0 $MPa^{0.5}$, and still more preferably 0.1 $MPa^{0.5}$ to 2.0 $MPa^{0.5}$. According to this aspect, the effects of the present invention tend to be more significant. In a case where the solvent B includes two or more kinds as at least one of the solvent B1 or the solvent B2, a combination of values in which the absolute value of the difference between the solubility parameter of the solvent B1 and the solubility parameter of the solvent B2 is the largest is used.

A boiling point of the solvent B1 is preferably 110° C. to 200° C., more preferably 110° C. to 190° C., and still more preferably 130° C. to 190° C.

Examples of the solvent B1 include an ether solvent, an ester solvent, and a ketone solvent. Among these, a ketone solvent is preferable from the viewpoint that the solubility of the near infrared absorbing compound and other resist materials in the ketone solvent is high. Specific examples of the solvent B1 include cyclohexanone, cyclopentanone, dipropylene glycol monomethyl ether, and 3-methoxybutanol. Among these, cyclopentanone is preferable from the viewpoint that the amount of a residual solvent in the film is small due to a low boiling point and a high vapor pressure at room temperature.

The solubility parameter of the solvent B2 is preferably 17.0 $MPa^{0.5}$ or higher and lower than 19.9 $MPa^{0.5}$ or higher than 22.3 $MPa^{0.5}$ and 25.0 $MPa^{0.5}$ or lower, more preferably 17.5 $MPa^{0.5}$ to 19.8 $MPa^{0.5}$ or higher than 22.3 $MPa^{0.5}$ and 24.0 $MPa^{0.5}$ or lower, and still more preferably 18.0 $MPa^{0.5}$ to 19.8 $MPa^{0.5}$ or higher than 22.3 $MPa^{0.5}$ and 23.5 $MPa^{0.5}$ or lower. The solubility parameter of the solvent B2 is still more preferably 18.2 $MPa^{0.5}$ to 19.0 $MPa^{0.5}$.

A boiling point of the solvent B2 is preferably 110° C. to 205° C., more preferably 110° C. to 170° C., and still more preferably 110° C. to 150° C.

Examples of the solvent B2 include an ether solvent, an ester solvent, and a ketone solvent. Among these, an ester solvent is preferable from the viewpoint that the solubility of the near infrared absorbing compound and other resist materials in the ester solvent is relatively high. Specific examples of the solvent B2 include propylene glycol monomethyl ether acetate, propylene glycol monomethyl ether, methylene chloride, butyl acetate, ethyl-3-ethoxypropionate, ethyl lactate, and N-methyl-2-pyrrolidone. Among these, propylene glycol monomethyl ether acetate is preferable from the viewpoint that the amount of a residual solvent in the film is small due to a low boiling point and a high vapor pressure at room temperature.

The content of the solvent B2 in the solvent B is 9 mass % or lower and preferably 0.1 to 9 mass %. The lower limit is more preferably 0.2 mass % or higher, still more preferably 0.5 mass % or higher, and even still more preferably 1 mass % or higher. The upper limit is more preferably 8.5 mass % or lower, still more preferably 8 mass % or lower, and even still more preferably 7.5 mass % or lower. By adjusting the content of the solvent B2 in the solvent B to be 9 mass % or lower, a spectral variation of the film in a near infrared range caused by a variation in humidity during application of the composition can be effectively suppressed. By adjusting the content of the solvent B2 to be 0.1 mass % or higher, the near infrared absorbing compound A can be made to appropriately aggregate in the film, and thus excellent heat resistance can be obtained. Further, excellent spectral characteristics can be obtained.

A mass ratio solvent B1:solvent B2 of the solvent B1 to the solvent B2 in the solvent B is preferably 91:9 to 99.9:0.1, more preferably 91.5:8.5 to 99.5:0.5, and still more preferably 92.5:7.5 to 99.0:1.0.

The content of the solvent in the composition according to the embodiment of the present invention is preferably 10 to 90 mass %, more preferably 20 to 80 mass %, and still more preferably 25 to 75 mass % with respect to the total mass of the composition.

<<Surfactant>>

The composition according to the embodiment of the present invention may include a surfactant. By the composition according to the embodiment of the present invention including the surfactant, compatibility between the near infrared absorbing compound A and the resin or the like in the film is appropriately reduced, the near infrared absorbing compound A can be made to appropriately aggregate, and heat resistance of the obtained film can be improved. In addition, by the composition including the surfactant, the application properties of the composition can be improved. As the surfactants, various surfactants such as a fluorine surfactant, a nonionic surfactant, a cationic surfactant, an anionic surfactant, or a silicone surfactant can be used.

Specific examples of the fluorine surfactant include a surfactant described in paragraphs "0060" to "0064" of JP2014-041318A (paragraphs "0060" to "0064" of corresponding WO2014/017669A) and a surfactant described in paragraphs "0117" to "0132" of JP2011-132503A, the content of which is incorporated herein by reference. Examples of a commercially available product of the fluorine surfactant include: MEGAFACE F171, F172, F173, F176, F177, F141, F142, F143, F144, R30, F437, F475, F479, F482, F554, and F780 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound having a molecular structure which has a functional group having a fluorine atom and in which the functional group having a fluorine atom is cut and a fluorine atom is volatilized during heat application can also be preferably used. Examples of the fluorine surfactant include MEGAFACE DS series (manufactured by DIC Corporation, refer to The Chemical Daily, Feb. 22, 2016 and Nikkei Business Daily, Feb. 23, 2016), for example, MEGAFACE DS-21.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

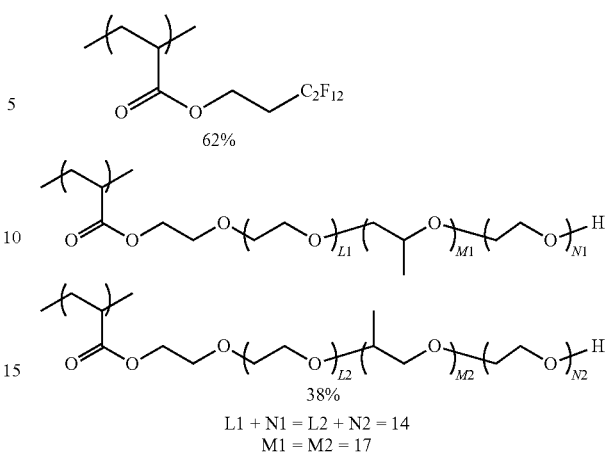

L1 + N1 = L2 + N2 = 14
M1 = M2 = 17

The weight-average molecular weight of the compound is preferably 3000 to 50000 and, for example, 14000. In the compound, "%" representing the proportion of a repeating unit is mol %.

As the fluorine surfactant, a compound having a fluorine atom and a curable group (hereinafter, also referred to as "fluorine-containing curable compound") is preferably used. By using the surfactant, the heat resistance of the obtained film can be further improved. More excellent solvent resistance can be obtained. The reason why excellent solvent resistance can be obtained by using the fluorine-containing curable compound is presumed to be as follows. The fluorine-containing curable compound has a low surface free energy. Therefore, for example, in a coating film that is formed by applying the composition to a support such as a substrate, the fluorine-containing curable compound is likely to be unevenly dispersed in the vicinity of a coating film surface opposite to the support. By curing the composition according to the embodiment of the present invention in a state where the fluorine-containing curable compound is unevenly dispersed as described above, a region where the proportion of a cured product of the fluorine-containing curable compound on a surface far from the substrate is high is formed. Due to the presence of the region, even in a case where the film is dipped in the solvent, the near infrared absorbing compound A is not likely to ooze out from the film surface, and excellent solvent resistance can be obtained.

Examples of the curable group in the fluorine-containing curable compound include a (meth)acryloyloxy group, an epoxy group, and an oxetanyl group. Among these, a (meth)acryloyloxy group is preferable.

It is preferable that the fluorine-containing curable compound includes at least one selected from the group consisting of an alkylene group substituted with a fluorine atom, an alkyl group substituted with a fluorine atom, and an aryl group substituted with a fluorine atom.

As the alkylene group substituted with a fluorine atom, a linear, branched, or cyclic alkylene group in which at least one hydrogen atom is substituted with a fluorine atom is preferable.

As the alkyl group substituted with a fluorine atom, a linear, branched, or cyclic alkyl group in which at least one hydrogen atom is substituted with a fluorine atom is preferable.

The number of carbon atoms in the alkylene group substituted with a fluorine atom and the alkyl group substituted with a fluorine atom is preferably 1 to 20, more preferably 1 to 10, and still more preferably 1 to 5.

In the aryl group substituted with a fluorine atom, it is preferable that the aryl group is directly substituted with a fluorine atom or is substituted with a trifluoromethyl group.

The alkylene group substituted with a fluorine atom, the alkyl group substituted with a fluorine atom, and the aryl group substituted with a fluorine atom may further have a substituent other than a fluorine atom. Specific examples can be found in paragraphs "0266" to "0272" of JP2011-100089A, the content of which is incorporated herein by reference.

It is preferable that the fluorine-containing curable compound is a compound having a fluoroether group and a curable group. Examples of the fluoroether group include a group X (group represented by Formula (X)) in which the alkylene group substituted with a fluorine atom is linked to an oxygen atom. As the fluoroether group, a perfluoroalkylene ether group is preferable. The perfluoroalkylene ether group represents that $L_A$ in the following Formula (X) a perfluoroalkylene group. The perfluoroalkylene group refers to a group in which all the hydrogen atoms in the alkylene group are substituted with a fluorine atom.

$$-(L_A\text{-}O)_n-\qquad\text{Formula (X)}$$

$L_A$ represents an alkylene group substituted with a fluorine atom. The number of carbon atoms in the alkylene group substituted with a fluorine atom is preferably 1 to 20, more preferably 1 to 10, and still more preferably 1 to 5. The alkylene group substituted with a fluorine atom may be linear or branched. n represents an integer of 1 or more, preferably 1 to 50 and more preferably 1 to 20. In a case where n represents 2 or more, a plurality of $L_A$'s in -($L_A$-O)— may be the same as or different from each other.

The fluorine-containing curable compound may be a monomer or a polymer but is preferably a polymer.

In a case where the fluorine-containing curable compound is a polymer, it is preferable that the polymer is a polymer that includes a repeating unit having a fluoroether group and a repeating unit having a curable group. In addition, a polymer that includes at least one of a repeating unit represented by the following Formula (B1), a repeating unit represented by the following Formula (B2), or a repeating unit represented by the following Formula (B3) is preferable, and a polymer that includes a repeating unit represented by the following Formula (B1) and a repeating unit represented by the following Formula (B3) is more preferable.

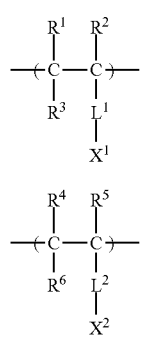

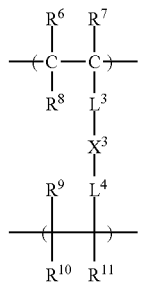

In Formulae (B1) to (B3), $R^1$ to $R^{11}$ each independently represent a hydrogen atom, an alkyl group, or a halogen atom. $L^1$ to $L^4$ each independently represent a single bond or a divalent linking group. $X^1$ represents a (meth)acryloyloxy group, an epoxy group, or an oxetanyl group, $X^2$ represents an alkyl group substituted with a fluorine atom or an aryl group substituted with a fluorine atom, and $X^3$ represents a group represented by Formula (X).

It is preferable that $R^1$ to $R^{11}$ in Formulae (B1) to (B3) each independently represent a hydrogen atom or an alkyl group. In a case where $R^1$ to $R^{11}$ represent an alkyl group, an alkyl group having 1 to 3 carbon atoms is preferable. In a case where $R^1$ to $R^{11}$ represent a halogen atom, a fluorine atom is preferable.

In a case where $L^1$ to $L^4$ in Formulae (B1) to (B3) represent a divalent linking group, examples of the divalent linking group include an alkylene group which may be substituted with a halogen atom, an arylene group which may be substituted with a halogen atom, —$NR^{12}$—, —$CONR^{12}$—, —CO—, —$CO_2$—, —$SO_2NR^{12}$—, —O—, —S—, —$SO_2$—, and a combination thereof. Among these, at least one selected from the group consisting of an alkylene group having 2 to 10 carbon atoms which may be substituted with a halogen atom and an arylene group having 6 to 12 carbon atoms which may be substituted with a halogen atom, or a group including a combination of the above group and at least one selected from the group consisting of —$NR^{12}$—, —$CONR^{12}$—, —CO—, —$CO_2$—, —$SO_2NR^{12}$—, —O—, —S—, and —$SO_2$— is preferable, and an alkylene group having 2 to 10 carbon atoms which may be substituted with a halogen atom, —$CO_2$—, —O—, —CO—, —$CONR^{12}$—, or a group including a combination thereof is more preferable. Here, $R^{12}$ represents a hydrogen atom or a methyl group.

The content of the repeating unit represented by Formula (B1) is preferably 30 to 95 mol % and more preferably 45 to 90 mol % with respect to all the repeating units in the fluorine-containing curable compound.

The total content of the repeating unit represented by Formula (B2) and the repeating unit represented by Formula (B3) is preferably 5 to 70 mol % and more preferably 10 to 60 mol % with respect to all the repeating units in the fluorine-containing curable compound. In a case where the fluorine-containing curable compound does not include the repeating unit represented by Formula (B2) and includes the repeating unit represented by Formula (B3), it is preferable that the content of the repeating unit represented by Formula (B2) is 0 mol % and the content of the repeating unit represented by Formula (B3) is in the above-described range.

The fluorine-containing curable compound may include repeating units other than the repeating units represented by Formulae (B1) to (B3). The content of the other repeating units is preferably 10 mol % or lower and more preferably 1 mol % or lower with respect to all the repeating units in the fluorine-containing curable compound.

In a case where the fluorine-containing curable compound is a polymer, the weight-average molecular weight is preferably 5000 to 100000 and more preferably 7000 to 50000. In addition, a dispersity (weight-average molecular weight/number-average molecular weight) is preferably 1.80 to 3.00 and more preferably 2.00 to 2.90.

As a commercially available product of the fluorine-containing curable compound, for example, MEGAFACE RS-72-K, MEGAFACE RS-75, MEGAFACE RS-76-E, MEGAFACE RS-76-NS, or MEGAFACE RS-77 (manufactured by DIC Corporation) can be used. As the fluorine-containing curable compound, a compound described in paragraphs "0050" to "0090" and "0289" to "0295" of JP2010-164965A or a compound described in paragraphs "0015" to "0158" of JP2015-117327A can also be used. In addition, as the fluorine-containing curable compound, a polymer that includes a repeating unit represented by Formula (B1-1) and a repeating unit represented by Formula (B3-1) can also be used. In Formula (B3-1), X represents a fluoromethylene group or a fluoroethylene group, and r represents the number of repeating units.

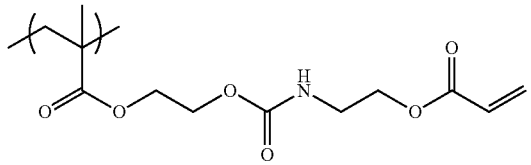

B1-1

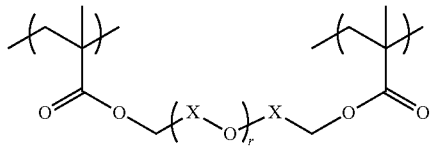

B3-1

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE)), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLFINE E1010, SUR-FYNOL 104, 400, and 440 (all of which are manufactured by Nissin Chemical Co., Ltd.).

Examples of the cationic surfactant include an organosiloxane polymer KP341 (manufactured by Shin-Etsu Chemical Co., Ltd.), a (meth)acrylic acid (co)polymer POLY-FLOW No. 75, No. 90, or No. 95 (manufactured by Kyoeisha Chemical Co., Ltd.), and W001 (manufactured by Yusho Co., Ltd.).

Examples of the anionic surfactant include W004, W005, and W017 (manufactured by Yusho Co., Ltd.), and SAN-DET BL (manufactured by Sanyo Chemical Industries Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP341, KF6001, and KF6002 (all of which are manufactured by Shin-Etsu Chemical Co., Ltd.); and BYK307, BYK323, and BYK330 (all of which are manufactured by BYK-Chemie Japan K.K.).

The content of the surfactant is preferably 0.1 to 15.0 mass %, more preferably 0.1 to 14.0 mass %, and still more preferably 0.5 to 13.0 mass % with respect to the total solid content of the composition. The content of the fluorine surfactant is preferably 0.1 to 100 mass %, more preferably 0.5 to 100 mass %, and still more preferably 1.0 to 100 mass % with respect to the total mass of the surfactant. The content of the fluorine-containing curable compound is preferably 0.1 to 100 mass %, more preferably 0.5 to 100 mass %, and still more preferably 1.0 to 100 mass % with respect to the total mass of the surfactant. As the surfactant, one kind may be used alone, or two or more kinds may be used in combination.

The composition according to the embodiment of the present invention may also not substantially include the surfactant. According to this aspect, a variation in the spectral characteristics of the obtained film in a near infrared range caused by a variation in humidity during application can be more effectively suppressed. In this specification, substantially not including the surfactant represents that the content of the surfactant is preferably 0.0005 mass % or lower, more preferably 0.0001 mass % or lower, and still more preferably 0 mass % with respect to the total solid content of the composition.

<<Chromatic Colorant>>

The composition according to the embodiment of the present invention may include a chromatic colorant. In this specification, "chromatic colorant" denotes a colorant other than a white colorant and a black colorant. It is preferable that the chromatic colorant is a colorant having an absorption in a wavelength range of 400 nm or longer and shorter than 650 nm.

As the chromatic colorant, a pigment or a dye may be used. As the pigment, an organic pigment is preferable. Examples of the organic pigment are as follows:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. A polymer of the above-described dyes may be used. A dye described in JP2015-028144A and JP2015-034966A can also be used.

In a case where the composition according to the embodiment of the present invention includes a chromatic colorant, the content of the chromatic colorant is preferably 0.1 to 70 mass % with respect to the total solid content of the composition. The lower limit is more preferably 0.5 mass % or higher and still more preferably 1.0 mass % or higher. The upper limit is more preferably 60 mass % or lower and still more preferably 50 mass % or lower.

The content of the chromatic colorant is preferably 10 to 1000 parts by mass and more preferably 50 to 800 parts by mass with respect to 100 parts by mass of the near infrared absorbing compound A (in a case where the composition further includes other near infrared absorbing compounds in addition to the near infrared absorbing compound A, with respect to the total mass of the near infrared absorbing compound A and the other near infrared absorbing compounds).

In addition, the total content of the chromatic colorant, the near infrared absorbing compound A, and the other near infrared absorbing compounds is preferably 1 to 80 mass % with respect to the total solid content of the composition according to the embodiment of the present invention. The lower limit is more preferably 5 mass % or higher and still more preferably 10 mass % or higher. The upper limit is more preferably 70 mass % or lower, and still more preferably 60 mass % or lower.

In a case where the composition according to the embodiment of the present invention includes two or more chromatic colorants, it is preferable that the total content of the two or more chromatic colorants is in the above-described range.

<<Coloring Material that Allows Transmission of Infrared Light and Shields Visible Light>>

The composition according to the embodiment of the present invention may also include the coloring material that allows transmission of infrared light and shields visible light (hereinafter, also referred to as "coloring material that shields visible light").

It is preferable that the coloring material that shields visible light is a coloring material that absorbs light in a wavelength range of violet to red. It is preferable that the coloring material that shields visible light is a coloring material that shields light in a wavelength range of 450 to 650 nm. In addition, it is preferable that the coloring material that shields visible light is a coloring material that allows transmission of light in a wavelength range of 900 to 1300 nm.

It is preferable that the coloring material that shields visible light satisfies at least one of the following requirement (1) or (2).

(1): The coloring material that shields visible light includes two or more chromatic colorants, and a combination of the two or more chromatic colorants forms black (2): The coloring material that shields visible light includes an organic black colorant Examples of the chromatic colorant are as described above. Examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include a compound described in JP2010-534726A, JP2012-515233A, and JP2012-515234A. For example, "Irgaphor Black" (manufactured by BASF SE) is available. Examples of the perylene compound include C.I. Pigment Black 31 and 32. Examples of the azomethine compound include a compound described in JP1989-170601A (JP-H1-170601A) and JP1990-034664A (JP-H2-034664A). For example, "CHROMOFINE BLACK A1103" (manufactured by Dainichiseika Color & Chemicals Mfg. Co., Ltd.) is available.

It is preferable that the coloring material that shields visible light is a material in which a ratio A/B of a minimum value A of an absorbance in a wavelength range of 450 to 650 nm to a minimum value B of an absorbance in a wavelength range of 900 to 1300 nm is 4.5 or higher.

The above-described characteristics may be satisfied using one material alone or using a combination of a plurality of materials. For example, in the aspect (1), it is preferable that the spectral characteristics are satisfied using a combination of a plurality of chromatic colorants. In the aspect (2), the spectral characteristics may be satisfied using an organic black colorant. In addition, the spectral characteristics may be satisfied using a combination of an organic black colorant and a chromatic colorant.

In a case where a combination of two or more chromatic colorants forms black, examples of the combination of chromatic colorants are as follows.

(1) An aspect in which the coloring material that shields visible light includes a yellow colorant, a blue colorant, a violet colorant, and a red colorant (2) An aspect in which the coloring material that shields visible light includes a yellow colorant, a blue colorant, and a red colorant (3) An aspect in which the coloring material that shields visible light includes a yellow colorant, a violet colorant, and a red colorant (4) An aspect in which the coloring material that shields visible light includes a yellow colorant and a violet colorant (5) An aspect in which the coloring material that shields visible light includes a green colorant, a blue colorant, a violet colorant, and a red colorant (6) An aspect in which the coloring material that shields visible light includes a violet colorant and an orange colorant (7) An aspect in which the coloring material that shields visible light includes a green colorant, a violet colorant, and a red colorant (8) An aspect in which the coloring material that shields visible light includes a green colorant and a red colorant For example, ratios (mass ratios) between the respective colorants are as follows.

TABLE 1

| No. | Yellow Colorant | Green Colorant | Blue Colorant | Violet Colorant | Red Colorant | Orange Colorant |
|---|---|---|---|---|---|---|
| 1 | 0.1 to 0.4 | | 0.1 to 0.6 | 0.01 to 0.3 | 0.1 to 0.6 | |
| 2 | 0.1 to 0.4 | | 0.1 to 0.6 | | 0.2 to 0.7 | |
| 3 | 0.1 to 0.6 | | | 0.1 to 0.6 | 0.1 to 0.6 | |
| 4 | 0.2 to 0.8 | | | 0.2 to 0.8 | | |
| 5 | | 0.1 to 0.4 | 0.1 to 0.4 | 0.1 to 0.4 | 0.1 to 0.4 | |
| 6 | | | | 0.2 to 0.6 | | 0.4 to 0.8 |
| 7 | | 0.1 to 0.5 | | 0.2 to 0.7 | 0.1 to 0.4 | |
| 8 | | 0.5 to 0.8 | | | 0.2 to 0.5 | |

In a case where the composition according to the embodiment of the present invention includes the coloring material that shields visible light, the content of the coloring material that shields visible light is preferably 30 mass % or lower, more preferably 20 mass % or lower, and still more preferably 15 mass % or lower with respect to the total solid content of the composition. The lower limit is, for example, 0.01 mass % or higher or 0.5 mass % or higher.

<<Pigment Derivative>>

The composition according to the embodiment of the present invention may further include a pigment derivative. Examples of the pigment derivative include a compound having a structure in which a portion of a pigment is substituted with an acidic group, a basic group, a group having a salt structure, or a phthalimidomethyl group. Among these, a pigment derivative represented by Formula (B 1) is preferable.

In Formula (B1), P represents a colorant structure, L represents a single bond or a linking group, X represents an acidic group, a basic group, a group having a salt structure, or a phthalimidomethyl group, m represents an integer of 1 or more, n represents an integer of 1 or more, in a case where m represents 2 or more, a plurality of L's and a plurality of X's may be different from each other, and in a case where n represents 2 or more, a plurality of X's may be different from each other.

In Formula (B1), P represents a colorant structure, preferably at least one selected from a pyrrolopyrrole colorant structure, a diketo pyrrolopyrrole colorant structure, a quinacridone colorant structure, an anthraquinone colorant structure, a dianthraquinone colorant structure, a benzoisoindole colorant structure, a thiazine indigo colorant structure, an azo colorant structure, a quinophthalone colorant structure, a phthalocyanine colorant structure, a naphthalocyanine colorant structure, a dioxazine colorant structure, a perylene colorant structure, a perinone colorant structure, a benzimidazolone colorant structure, a benzothiazole colorant structure, a benzimidazole colorant structure, or a benzoxazole colorant structure, and more preferably at least one selected from a pyrrolopyrrole colorant structure, a diketo pyrrolo pyrrolopyrrole colorant structure, a quinacridone colorant structure, or a benzimidazolone colorant structure.

In Formula (B1), L represents a single bond or a linking group. The linking group is preferably a group composed of 1 to 100 carbon atoms, 0 to 10 nitrogen atoms, 0 to 50 oxygen atoms, 1 to 200 hydrogen atoms, and 0 to 20 sulfur atoms. The linking group may be unsubstituted or may further have a substituent.

In Formula (B1), X represents an acidic group, a basic group, a group having a salt structure, or a phthalimidomethyl group.

Specific examples of the pigment derivative include the following compounds. In the following structural formula, Ph represents a phenyl group.

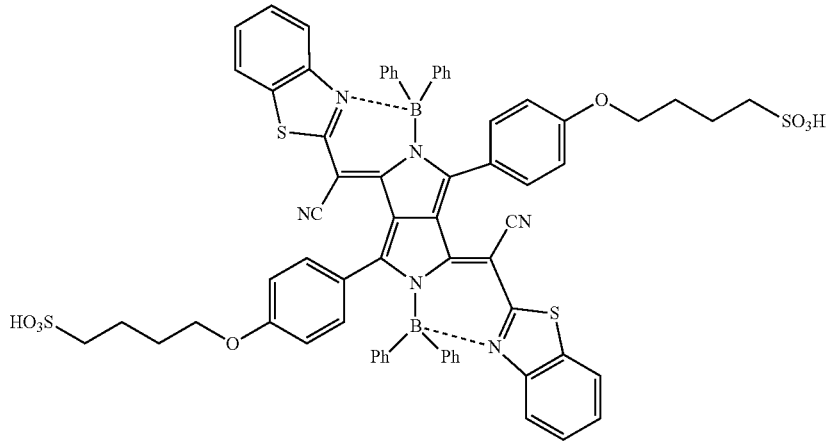

In a case where the composition according to the embodiment of the present invention includes the pigment derivative, the content of the pigment derivative is preferably 1 to 50 parts by mass with respect to 100 parts by mass of the pigment. The lower limit value is more preferably 3 parts by mass or more and still more preferably 5 parts by mass or more. The upper limit value is more preferably 40 parts by mass or less and still more preferably 30 parts by mass or less. In a case where the content of the pigment derivative is in the above-described range, the pigment dispersibility can be improved, and aggregation of the pigment can be effectively suppressed. As the pigment derivative, one kind may be used alone, or two or more kinds may be used. In a case where two or more pigment derivatives are used in combination, it is preferable that the total content of the two or more pigment derivatives is in the above-described range.

<<Resin>>

It is preferable that the composition according to the embodiment of the present invention includes a resin. The resin is mixed, for example, in order to disperse the pigment and the like in the composition and to be added as a binder. The resin which is mainly used to disperse the pigments and the like will also be called a dispersant. However, the above-described uses of the resin are merely exemplary, and the resin can be used for purposes other than the uses.

The weight-average molecular weight (Mw) of the resin is preferably 2000 to 2000000. The upper limit is more preferably 1000000 or lower and still more preferably 500000 or lower. The lower limit is more preferably 3000 or higher and still more preferably 5000 or higher. In addition, in a case where the resin is an epoxy resin, the weight-average molecular weight (Mw) of the epoxy resin is preferably 100 or higher and more preferably 200 to 2000000. The upper limit is more preferably 1000000 or lower and still more preferably 500000 or lower. The lower limit is preferably 100 or higher and more preferably 200 or higher.

Examples of the resin include a (meth)acrylic resin, an epoxy resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, and a styrene resin. Among these resins, one kind may be used alone, or a mixture of two or more kinds may be used.

Examples of the (meth)acrylic resin include a polymer including a repeating unit derived from (meth)acrylic acid and/or an ester thereof. Specific examples of the (meth) acrylic resin include a polymer obtained by polymerization of at least one selected from (meth)acrylic acid, a (meth) acrylic acid ester, a (meth)acrylamide, or a (meth)acrylonitrile.

Examples of the polyester resin include: a polymer obtained by a reaction of a polyol (for example, ethylene glycol, propylene glycol, glycerin, or trimethylolpropane) and a polybasic acid (for example, an aromatic dicarboxylic acid such as terephthalic acid, isophthalic acid, or naphthalenedicarboxylic acid, an aromatic dicarboxylic acid in which a hydrogen atom of an aromatic ring in the above-described aromatic dicarboxylic acid is substituted with a methyl group, an ethyl group, a phenyl group, or the like, an aliphatic dicarboxylic acid having 2 to 20 carbon atoms such as adipic acid, sebacic acid, or dodecanedicarboxylic acid, or an alicyclic dicarboxylic acid such as cyclohexanedicarboxylic acid); and a polymer (for example, polycaprolactone) obtained by ring-opening polymerization of a cyclic ester compound such as a caprolactone monomer.

Examples of the epoxy resin include an epoxy resin which is a glycidyl-etherified product of a phenol compound, an epoxy resin which is a glycidyl-etherified product of various novolac resins, an alicyclic epoxy resin, an aliphatic epoxy resin, a heterocyclic epoxy resin, a glycidyl ester epoxy resin, a glycidyl amine epoxy resin, an epoxy resin which is a glycidylated product of a halogenated phenol, a condensate of a silicon compound having an epoxy group and another silicon compound, and a copolymer of a polymerizable unsaturated compound having an epoxy group and another polymerizable unsaturated compound.

Examples of the epoxy resin which is a glycidyl-etherified product of a phenol compound include: 2-[4-(2,3-epoxypropoxy)phenyl]-2-[4-[1,1-bis[4-(2,3-hydroxy)phenyl] ethyl]phenyl]propane, bisphenol A, bisphenol F, bisphenol S, 4,4'-biphenol, tetramethyl bisphenol A, dimethyl bisphenol A, tetramethyl bisphenol F, dimethyl bisphenol F, tetramethyl bisphenol S, dimethyl bisphenol S, tetramethyl-4,4'-biphenol, dimethyl-4,4'-biphenol, 1-(4-hydroxyphenyl)-2-[4-(1,1-bis-(4-hydroxyphenyl)ethyl)phenyl]propane, 2,2'-methylene-bis(4-methyl-6-t-butylphenol), 4,4'-butylidene-bis(3-methyl-6-t-butylphenol), trishydroxyphenylmethane, resorcinol, hydroquinone, pyrogallol, phloroglucinol, a phenol having a diisopropylidene skeleton; a phenol having a fluorene skeleton such as 1,1-di-4-hydroxyphenyl fluorene; and an epoxy resin which is a glycidyl-etherified product of a polyphenol compound, such as phenolic polybutadiene.

Examples of the epoxy resin which is a glycidyl-etherified product of a novolac resin include glycidyl-etherified products of various novolac resins including: novolac resins which contain various phenols, for example, phenol, cresols, ethyl phenols, butyl phenols, octyl phenols, bisphenols such as bisphenol A, bisphenol F, or bisphenol S, or naphthols; phenol novolac resins having a xylylene skeleton; phenol novolac resins having a dicyclopentadiene skeleton; phenol novolac resins having a biphenyl skeleton; or phenol novolac resins having a fluorene skeleton.

Examples of the alicyclic epoxy resin include an alicyclic epoxy resin having an aliphatic ring skeleton such as 3,4-epoxycyclohexylmethyl-(3,4-epoxy)cyclohexylcarboxylate or bis(3,4-epoxycyclohexylmethyl)adipate.

Examples of the aliphatic epoxy resin include glycidyl ethers of polyhydric alcohols such as 1,4-butanediol, 1,6-hexanediol, polyethylene glycol, or pentaerythritol.

Examples of the heterocyclic epoxy resin include a heterocyclic epoxy resin having a heterocycle such as an isocyanuric ring or a hydantoin ring.

Examples of the glycidyl ester epoxy resin include an epoxy resin including a carboxylic acid ester such as hexahydrophthalic acid diglycidyl ester.

Examples of the glycidyl amine epoxy resin include an epoxy resin which is a glycidylated product of an amine such as aniline or toluidine.

Examples of the epoxy resin which is a glycidylated product of a halogenated phenol include an epoxy resin which is a glycidylated product of a halogenated phenol such as brominated bisphenol A, brominated bisphenol F, brominated bisphenol S, brominated phenol novolac, brominated cresol novolac, chlorinated bisphenol S, or chlorinated bisphenol A.

Examples of a commercially available product of the copolymer of a polymerizable unsaturated compound having an epoxy group and another polymerizable unsaturated compound include MARPROOF G-0150M, G-0105SA, G-0130SP, G-0250SP, G-1005S, G-1005SA, G-1010S, G-2050M, G-01100, and G-01758 (all of which are manufactured by NOF Corporation; epoxy group-containing polymers). Examples of the polymerizable unsaturated compound having an epoxy group include glycidyl acrylate, glycidyl methacrylate, and 4-vinyl-1-cyclohexene-1,2-epoxide. In addition, examples of a copolymer of the other polymerizable unsaturated compound include methyl (meth)acrylate, benzyl (meth)acrylate, cyclohexyl (meth)acrylate, styrene, and vinyl cyclohexane. In particular, methyl (meth)acrylate, benzyl (meth)acrylate, or styrene is preferable.

The epoxy equivalent of the epoxy resin is preferably 310 to 3300 g/eq, more preferably 310 to 1700 g/eq, and still more preferably 310 to 1000 g/eq.

The resin used in the present invention may have an acid group. Examples of the acid group include a carboxyl group, a phosphate group, a sulfonate group, and a phenolic hydroxyl group. Among these acid groups, one kind may be used alone, or two or more kinds may be used in combination. The resin having an acid group can also be used as an alkali-soluble resin. In addition, the resin having an acid group can also be used as the dispersant.

As the resin having an acid group, a polymer having a carboxyl group at a side chain is preferable. Specific examples of the resin include an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac resin, an acidic cellulose derivative having a carboxyl group at a side chain thereof, and a resin obtained by adding an acid anhydride to a polymer having a hydroxyl group. In particular, a copolymer of (meth)acrylic acid and another monomer which is copolymerizable with the (meth)acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth) acrylate, propyl (meth)acrylate, butyl (meth)acrylate, isobutyl (meth)acrylate, pentyl (meth)acrylate, hexyl (meth) acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of other monomers include a N-position-substituted maleimide monomer described in JP1998-300922A (JP-H10-300922A) such as N-phenylmaleimide or N-cyclohexylmaleimide. Among these monomers which are copolymerizable with the (meth)acrylic acid, one kind may be used alone, or two or more kinds may be used in combination.

As the resin having an acid group, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxypropyl (meth) acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the resin having an acid group, a polymer obtained by polymerization of monomer components including a compound represented by the following Formula (ED1) and/or a compound represented by the following Formula (ED2) (hereinafter, these compounds will also be referred to as "ether dimer") is also preferable.

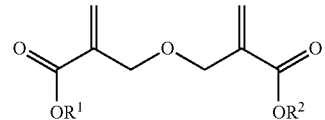

(ED1)

In Formula (ED1), $R^1$ and $R^2$ each independently represent a hydrogen atom or a hydrocarbon group having 1 to 25 carbon atoms which may have a substituent.

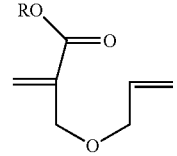

(ED2)

In Formula (ED2), R represents a hydrogen atom or an organic group having 1 to 30 carbon atoms. Specific examples of Formula (ED2) can be found in the description of JP2010-168539A.

Specific examples of the ether dimer can be found in paragraph "0317" of JP2013-029760A, the content of which is incorporated herein by reference. Among these ether dimers, one kind may be used alone, or two or more kinds may be used in combination.

The resin having an acid group may include a repeating unit which is derived from a compound represented by the following Formula (X).

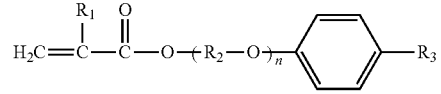

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

The details of the resin having an acid group can be found in paragraphs "0558" to "0571" of JP2012-208494A (paragraphs "0685" to "0700" of corresponding US2012/0235099A) and paragraphs "0076" to "0099" of JP2012-198408A, the contents of which are incorporated herein by reference.

The acid value of the resin having an acid group is preferably 30 to 200 mgKOH/g. The lower limit is more preferably 50 mgKOH/g or higher and still more preferably 70 mgKOH/g or higher. The upper limit is more preferably 150 mgKOH/g or lower and still more preferably 120 mgKOH/g or lower.

The resin may have a curable group. Examples of the curable group include a group having an ethylenically unsaturated bond, an epoxy group, a methylol group, and an alkoxysilyl group. Examples of the group having an ethylenically unsaturated bond include a vinyl group, a (meth) allyl group, and a (meth)acryloyl group. Examples of the alkoxysilyl group include a monoalkoxysilyl group, a dialkoxysilyl group, and a trialkoxysilyl group. Examples of the repeating unit having a curable group include the following Formulae (A2-1) to (A2-4).

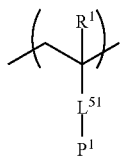
(A2-1)

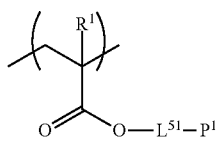
(A2-2)

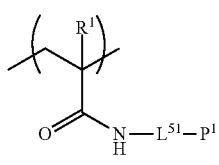
(A2-3)

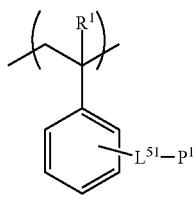
(A2-4)

$R^1$ represents a hydrogen atom or an alkyl group. The number of carbon atoms in the alkyl group is preferably 1 to 5, more preferably 1 to 3, and still more preferably 1. It is preferable that $R^1$ represents a hydrogen atom or a methyl group.

$L^{51}$ represents a single bond or a divalent linking group. Examples of the divalent linking group include an alkylene group, an arylene group, —O—, —S—, —CO—, —COO—, —OCO—, —SO$_2$—, —NR— (R represents a hydrogen atom or an alkyl group and preferably a hydrogen atom), and a group including a combination thereof. Among these, a group including a combination —O— and at least one of an alkylene group, an arylene group, or an alkylene group is preferable. The number of carbon atoms in the alkylene group is preferably 1 to 30, more preferably 1 to 15, and still more preferably 1 to 10. The alkylene group may have a substituent but is preferably unsubstituted. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10.

$P^1$ represents a curable group. Examples of the curable group include a group having an ethylenically unsaturated bond, an epoxy group, a methylol group, and an alkoxysilyl group. Examples of the group having an ethylenically unsaturated bond include a vinyl group, a (meth)allyl group, and a (meth)acryloyl group. Examples of the alkoxysilyl group include a monoalkoxysilyl group, a dialkoxysilyl group, and a trialkoxysilyl group.

Examples of the resin having a curable group include DIANAL NR series (manufactured by Mitsubishi Rayon Co., Ltd.), PHOTOMER 6173 (a COOH-containing polyurethane acrylic oligomer; manufactured by Diamond Shamrock Co., Ltd.), VISCOAT R-264 and KS Resist 106 (both of which are manufactured by Osaka Organic Chemical Industry Ltd.), CYCLOMER P series (for example, ACA230AA) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.). In addition, for example, a product described above regarding the epoxy resin can also be used.

In the composition according to the embodiment of the present invention, as the resin, a resin having a repeating unit represented by any one of Formulae (A3-1) to (A3-7) is also preferably used.

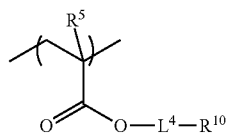
(A3-1)

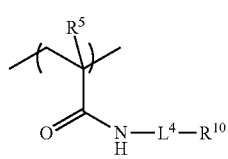
(A3-2)

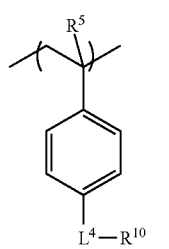
(A3-3)

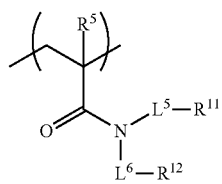
(A3-4)

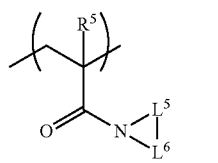
(A3-5)

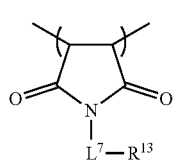
(A3-6)

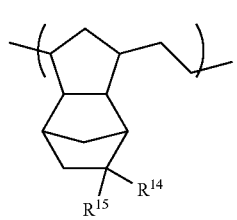
(A3-7)

In the formulae, $R^5$ represents a hydrogen atom or an alkyl group, $L^4$ to $L^7$ each independently represent a single bond or a divalent linking group, and $R^{10}$ to $R^{13}$ each independently represent an alkyl group or an aryl group. $R^{14}$ and $R^{15}$ each independently represent a hydrogen atom or a substituent.

$R^5$ represents a hydrogen atom or an alkyl group. The number of carbon atoms in the alkyl group is preferably 1 to 5, more preferably 1 to 3, and still more preferably 1. It is preferable that $R^5$ represents a hydrogen atom or a methyl group.

$L^4$ to $L^7$ each independently represent a single bond or a divalent linking group. Examples of the divalent linking group include an alkylene group, an arylene group, —O—, —S—, —CO—, —COO—, —OCO—, —SO$_2$—, —NR$^{10}$— (R$^{10}$ represents a hydrogen atom or an alkyl group and preferably a hydrogen atom), and a group including a combination thereof. Among these, a group including a combination —O— and at least one of an alkylene group, an arylene group, or an alkylene group is preferable. The number of carbon atoms in the alkylene group is preferably 1 to 30, more preferably 1 to 15, and still more preferably 1 to 10. The alkylene group may have a substituent but is preferably unsubstituted. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10.

The alkyl group represented by $R^{10}$ may be linear, branched, or cyclic and is preferably cyclic. The alkyl group may have a substituent or may be unsubstituted. The number of carbon atoms in the alkyl group is preferably 1 to 30, more preferably 1 to 20, and still more preferably 1 to 10. The number of carbon atoms in the aryl group represented by $R^{10}$ is preferably 6 to 18, more preferably 6 to 12, and still more preferably 6. It is preferable that $R^{10}$ represents a cyclic alkyl group or an aryl group.

The alkyl group represented by $R^{11}$ and $R^{12}$ may be linear, branched, or cyclic and is preferably linear or branched. The alkyl group may have a substituent or may be unsubstituted. The number of carbon atoms in the alkyl group is preferably 1 to 12, more preferably 1 to 6, and still more preferably 1 to 4. The number of carbon atoms in the aryl group represented by $R^{11}$ and $R^{12}$ is preferably 6 to 18, more preferably 6 to 12, and still more preferably 6. It is preferable that $R^{11}$ and $R^{12}$ represent a linear or branched alkyl group.

The alkyl group represented by $R^{13}$ may be linear, branched, or cyclic and is preferably linear or branched. The alkyl group may have a substituent or may be unsubstituted. The number of carbon atoms in the alkyl group is preferably 1 to 12, more preferably 1 to 6, and still more preferably 1 to 4. The number of carbon atoms in the aryl group represented by $R^{13}$ is preferably 6 to 18, more preferably 6 to 12, and still more preferably 6. It is preferable that $R^{13}$ represents a linear or branched alkyl group or an aryl group.

Examples of the substituent represented by $R^{14}$ and $R^{15}$ include a halogen atom, a cyano group, a nitro group, an alkyl group, an alkenyl group, an alkynyl group, an aryl group, a heteroaryl group, an aralkyl group, an alkoxy group, an aryloxy group, a heteroaryloxy group, an alkylthio group, an arylthio group, a heteroarylthio group, —NR$^{a1}$R$^{a2}$, —COR$^{a3}$, —COOR$^{a4}$, —OCOR$^{a5}$, —NHCOR$^{a6}$, —CONR$^{a7}$R$^{a8}$, —NHCONR$^{a9}$R$^{a10}$, —NHCOOR$^{a11}$, —SO$_2$R$^{a12}$, —SO$_2$OR$^{a13}$, —NHSO$_2$R$^{a14}$, and —SO$_2$NR$^{a15}$R$^{a16}$. $R^{a1}$ to $R^{a16}$ each independently represent a hydrogen atom, an alkyl group, an alkenyl group, an alkynyl group, an aryl group, or a heteroaryl group. In particular, it is preferable that at least one of $R^{14}$ or $R^{15}$ represents a cyano group or —COOR$^{a4}$. It is preferable that $R^{a4}$ represents a hydrogen atom, an alkyl group, or an aryl group.

Examples of a commercially available product of the resin having a repeating unit represented by Formula (A3-7) include ARTON F4520 (manufactured by JSR Corporation). The details of the resin having a repeating unit represented by Formula (A3-7) can be found in paragraphs "0053" to "0075" and "0127" to "0130" of JP2011-100084A, the content of which is incorporated herein by reference.

In a case where the composition according to the embodiment of the present invention includes a pigment, it is preferable that the composition includes a resin as a dispersant. The resin which functions as a dispersant is preferably an acidic resin and/or a basic resin. Here, the acidic resin refers to a resin in which the amount of an acid group is more than the amount of a basic group. In a case where the sum of the amount of an acid group and the amount of a basic group in the acidic resin is represented by 100 mol %, the amount of the acid group in the acidic resin is preferably 70 mol % or higher and more preferably substantially 100 mol %. The acid group in the acidic resin is preferably a carboxyl group. An acid value of the acidic resin is preferably 40 to 105 mgKOH/g, more preferably 50 to 105 mgKOH/g, and still more preferably 60 to 105 mgKOH/g. The basic resin refers to a resin in which the amount of a basic group is more than the amount of an acid group. In a case where the sum of the amount of an acid group and the amount of a basic group in the basic resin is represented by 100 mol %, the amount of the basic group in the resin is preferably higher than 50 mol %. The basic group in the basic resin is preferably amine.

Examples of the dispersant include: a polymer dispersant (for example, a resin having an amine group (polyamideamine or a salt thereof), an oligo imine resin, a polycarboxylic acid or a salt thereof, a high-molecular-weight unsaturated acid ester, a modified polyurethane, a modified polyester, a modified poly(meth)acrylate, a (meth)acrylic copolymer, or a naphthalene sulfonic acid formalin condensate). In terms of a structure, the polymer dispersant can be further classified into a linear polymer, a terminal-modified polymer, a graft polymer, and a block polymer.

Examples of the terminal-modified polymer include a polymer having a phosphate group at a terminal thereof described in JP1991-112992A (JP-H3-112992A) or JP2003-533455A, a polymer having a sulfo group at a terminal thereof described in JP2002-273191A, and a polymer having a partial skeleton or a heterocycle of an organic colorant described in JP1997-077994A (JP-H9-077994A). In addition, polymers described in JP2007-277514A in which two or more anchor sites (for example, an acid group, a basic group, a partial skeleton or a heterocycle of an organic colorant) to a pigment surface are introduced into a terminal thereof are also preferable due to its dispersion stability.

Examples of the block polymer include a block polymer described in JP2003-049110A or JP2009-052010A.

Examples of the graft polymer include a reaction product of poly(low-alkylene imine) and polyester described in JP1979-037082A (JP-S54-037082A), JP1996-507960A (JP-H8-507960A), or JP2009-258668A, a reaction product of polyallylamine and polyester described in JP1997-169821A (JP-H9-169821A), a copolymer of a macromonomer and a monomer having a nitrogen-containing group described in JP1998-339949A (JP-H10-339949A) or JP2004-037986A, a graft polymer having a partial skeleton or a heterocycle of an organic colorant described in JP2003-238837A, JP2008-

009426A, or JP2008-081732A, and a copolymer of a macromonomer and an acid group-containing monomer described in JP2010-106268A.

In addition, as the dispersant, a graft copolymer described in paragraphs "0025" to "0094" of JP2012-255128A or an oligoimine resin described in paragraphs "0102" to "0174" of JP2012-255128A can also be used, the contents of which are incorporated herein by reference. In addition, specific examples of the oligoimine resin include the following resins. In the following resins, a numerical value added to a repeating unit at a main chain represents a molar ratio, and a numerical value added to a repeating unit at a side chain represents the number of the repeating units.

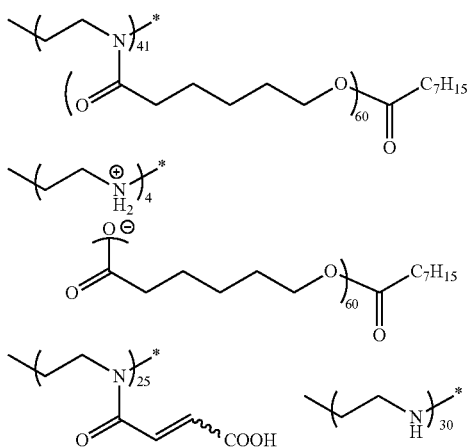

The dispersant is available as a commercially available product, and specific examples thereof include Disperbyk-111 (manufactured by BYK Chemie). In addition, a pigment dispersant described in paragraphs "0041" to "0130" of JP2014-130338A can also be used, the content of which is incorporated herein by reference. The resin having an acid group or the like can also be used as a dispersant.

In the composition according to the embodiment of the present invention, the content of the resin is preferably 1 to 80 mass % with respect to the total solid content of the composition. The lower limit is more preferably 5 mass % or higher and still more preferably 7 mass % or higher. The upper limit is more preferably 50 mass % or lower, and still more preferably 30 mass % or lower.

In addition, in a case where the composition includes a dispersant as the resin, the content of the dispersant is preferably 0.1 to 40 mass % with respect to the total solid content of the composition. The upper limit is more preferably 20 mass % or lower and still more preferably 10 mass % or lower. The lower limit is more preferably 0.5 mass % or higher and still more preferably 1 mass % or higher. The content of the dispersant is preferably 1 to 100 parts by mass with respect to 100 parts by mass of the pigment. The upper limit is more preferably 80 parts by mass or less and still more preferably 60 parts by mass or less. The lower limit is more preferably 2.5 parts by mass or more and still more preferably 5 parts by mass or more.

<<Polymerizable Compounds>>

It is preferable that the composition according to the embodiment of the present invention includes a polymerizable compound. As the polymerizable compound, a compound that is polymerizable by the action of a radical is preferable. That is, it is preferable that the polymerizable compound is a radically polymerizable compound. As the polymerizable compound, a compound having one or more groups having an ethylenically unsaturated bond is preferable, a compound having two or more groups having an ethylenically unsaturated bond is more preferable, and a compound having three or more groups having an ethylenically unsaturated bond is still more preferable. The upper limit of the number of the groups having an ethylenically unsaturated bond is, for example, preferably 15 or less and more preferably 6 or less. Examples of the group having an ethylenically unsaturated bond include a vinyl group, a styryl group, a (meth)allyl group, and a (meth)acryloyl group. Among these, a (meth)acryloyl group is preferable. The polymerizable compound is preferably a (meth)acrylate compound having 3 to 15 functional groups and more preferably a (meth)acrylate compound having 3 to 6 functional groups.

The polymerizable compound may be in the form of a monomer or a polymer and is preferably a monomer. The molecular weight of the monomer type polymerizable compound is preferably 100 to 3000. The upper limit is more preferably 2000 or lower and still more preferably 1500 or lower. The lower limit is more preferably 150 or higher and still more preferably 250 or higher. In addition, it is preferable that the polymerizable compound is a compound substantially not having a molecular weight distribution. Here, the compound substantially not having a molecular weight distribution represents that the dispersity (weight-average molecular weight (Mw)/number-average molecular weight (Mn)) of the compound is preferably 1.0 to 1.5 and more preferably 1.0 to 1.3.

Examples of the polymerizable compound can be found in paragraphs "0033" and "0034" of JP2013-253224A, the content of which is incorporated herein by reference. As the polymerizable compound, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a structure in which the (meth)acryloyl group is bonded through an ethylene glycol residue and/or a propylene glycol residue is preferable. Oligomers of the above-described examples can be used. For example, the details of the polymerizable compound can be found in paragraphs "0034" to "0038" of JP2013-253224A, the content of which is incorporated herein by reference. Examples of the polymerizable compound include a polymerizable monomer in paragraph "0477" of JP2012-208494A (paragraph "0585" of corresponding US2012/0235099A), the content of which is incorporated herein by reference. Diglycerin ethylene oxide (EO)-modified (meth)acrylate (as a commercially available product, M-460 manufactured by Toagosei Co., Ltd.), pentaerythritol tetraacrylate (A-TMMT manufactured by Shin-Nakamura Chemical Co., Ltd.), or 1,6-hexanediol diacrylate (KAYARAD HDDA manufactured by Nippon Kayaku Co., Ltd.) is also preferable. Oligomers of the above-described examples can be used. For examples, RP-1040 (manufactured by Nippon Kayaku Co., Ltd.) is used.

The polymerizable compound may have an acid group such as a carboxyl group, a sulfo group, or a phosphate group. Examples of the polymerizable compound having an acid group include an ester of an aliphatic polyhydroxy compound and an unsaturated carboxylic acid. A polymerizable compound having an acid group obtained by causing a nonaromatic carboxylic anhydride to react with an unreacted hydroxyl group of an aliphatic polyhydroxy compound is preferable. In particular, it is preferable that, in this ester, the aliphatic polyhydroxy compound is pentaerythritol and/or dipentaerythritol. Examples of a commercially available product of the polymerizable compound having an acid group include M-305, M-510, and M-520 of ARONIX series as polybasic acid-modified acrylic oligomer (manufactured by Toagosei Co., Ltd.). The acid value of the polymerizable compound having an acid group is preferably 0.1 to 40 mgKOH/g. The lower limit is more preferably 5 mgKOH/g or higher. The upper limit is more preferably 30 mgKOH/g or lower.

In addition, it is also preferable that the polymerizable compound is a compound having a caprolactone structure. The polymerizable compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. Examples of the polymerizable compound having a caprolactone structure can be found in paragraphs "0042" to "0045" of JP2013-253224A, the content of which is incorporated herein by reference. Examples of the compound having a caprolactone structure include: DPCA-20, DPCA-30, DPCA-60, and DPCA-120 which are commercially available as KAYARADDPCA series manufactured by Nippon Kayaku Co., Ltd.; SR-494 (manufactured by Sartomer) which is a tetrafunctional acrylate having four ethyleneoxy chains; and TPA-330 which is a trifunctional acrylate having three isobutyleneoxy chains.

As the polymerizable compound, a urethane acrylate described in JP1973-041708B (JP-S48-041708B), JP1976-037193A (JP-S51-037193A), JP1990-032293B (JP-H2-032293B), or JP1990-016765B (JP-H2-016765B), or a urethane compound having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) is also preferable. In addition, an addition-polymerizable compound having an amino structure or a sulfide structure in the molecules described in JP1988-277653A (JP-S63-277653A), JP1988-260909A (JP-S63-260909A), or JP1989-105238A (JP-H1-105238A) can be used. Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

In a case where the composition according to the embodiment of the present invention includes the polymerizable compound, the content of the polymerizable compound is preferably 0.1 to 40 mass % with respect to the total solid content of the composition. For example, the lower limit is more preferably 0.5 mass % or higher and still more preferably 1 mass % or higher. For example, the upper limit is more preferably 30 mass % or lower and still more preferably 20 mass % or lower. As the polymerizable compound, one kind may be used alone, or two or more kinds may be used in combination. In a case where two or more polymerizable compounds are used in combination, it is preferable that the total content of the two or more polymerizable compounds is in the above-described range.

In addition, in a case where the composition includes an epoxy resin and a polymerizable compound, a mass ratio (polymerizable compound:epoxy resin) of the polymerizable compound to the epoxy resin is preferably 100:1 to 100:400 and more preferably 100:1 to 100:100.

<<Photopolymerization Initiator>>

The composition according to the embodiment of the present invention may include a photopolymerization initiator. In particular, in a case where the composition according to the embodiment of the present invention includes the polymerizable compound (preferably the radically polymerizable compound), it is preferable that the composition includes a photopolymerization initiator. The photopolymerization initiator is not particularly limited and can be appropriately selected from well-known photopolymerization initiators. For example, a compound having photosensitivity to light in a range from an ultraviolet range to a visible range is preferable. It is preferable that the photopolymerization initiator is a photoradical polymerization initiator.

Examples of the photopolymerization initiator include: a halogenated hydrocarbon derivative (For example, a compound having a triazine skeleton or a compound having an oxadiazole skeleton); an acylphosphine compound such as acylphosphine oxide; hexaarylbiimidazole; an oxime compound such as an oxime derivative; an organic peroxide, a thio compound, a ketone compound, an aromatic onium salt, keto oxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayshi et al., Great Britain Patent No. 1388492, JP1978-133428A (JP-S53-133428A), Great German Patent No. 3337024, J. Org. Chem.; 29, 1527 (1964) by F. C. Schaefer et al., JP1987-058241A (JP-S62-058241A), JP1993-281728A (JP-H5-281728A), JP1993-034920A (JP-H5-034920A), and U.S. Pat. No. 4,212,976A.

In addition, from the viewpoint of exposure sensitivity, as the photopolymerization initiator, a compound selected from the group consisting of a trihalomethyltriazine compound, a benzyldimethylketanol compound, an α-hydroxy ketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, and a 3-aryl-substituted coumarin compound is preferable.

As the photopolymerization initiator, an α-hydroxyketone compound, an α-aminoketone compound, or an acylphosphine compound can also be preferably used. For example, an α-aminoketone compound described in JP1998-291969A (JP-H10-291969A) or an acylphosphine compound described in JP4225898B can also be used. As the α-hydroxyketone compound, for example, IRGACURE-184, DAROCUR-1173, IRGACURE-500, IRGACURE-2959, or IRGACURE-127 (all of which are manufactured by BASF SE) can be used. As the α-aminoketone compound, IRGA- CURE-907, IRGACURE-369, IRGACURE-379, or IRGACURE-379EG (all of which are manufactured by BASF SE) can be used. As the α-aminoketone compound, a compound described in JP2009-191179A can be used. As the acylphosphine compound, IRGACURE-819, or DAROCUR-TPO (all of which are manufactured by BASF SE) which is a commercially available product can be used.

As the photopolymerization initiator, an oxime compound can be preferably used. Specific examples of the oxime compound include a compound described in JP2001-233842A, JP2000-080068A, JP2006-342166A, and JP2016-021012A. Examples of the oxime compound which can be preferably used in the present invention include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. In addition, examples of the oxime compound include a compound described in J.C.S. Perkin II (1979), pp. 1653-1660, J.C.S. Perkin II (1979), pp. 156-162 and Journal of Photopolymer Science and Technology (1995), pp. 202-232, JP2000-066385A, JP2000-080068A, JP2004-534797A, or JP2006-342166A.

As a commercially available product of the oxime compound, IRGACURE-OXE01, IRGACURE-OXE02, IRGACURE-OXE03, or IRGACURE-OXE04 (all of which are manufactured by BASF SE) can also be preferably used. TR-PBG-304 (manufactured by Changzhou Tronly New Electronic Materials Co., Ltd.), ADEKA ARKLS NCI-831 (manufactured by Adeka Corporation), ADEKA ARKLS NCI-930 (manufactured by Adeka Corporation), ADEKA OPTOMER N-1919 (manufactured by Adeka Corporation), a photopolymerization initiator 2 described in JP2012-014052A can also be used.

In addition, in addition to the above-described oxime compounds, for example, a compound described in JP2009-519904A in which oxime is linked to a N-position of a carbazole ring, a compound described in U.S. Pat. No. 7,626,957B in which a hetero substituent is introduced into the benzophenone site, a compound described in JP2010-015025A or US2009/0292039A in which a nitro group is introduced into a colorant site, a ketoxime compound described in WO2009/131189A, a compound described in U.S. Pat. No. 7,556,910B having a triazine skeleton and an oxime skeleton in the same molecule, a compound described in JP2009-221114A having an absorption maximum at 405 nm and having excellent sensitivity to a light source of g-rays may be used.

As the oxime compound, a compound represented by the following Formula (OX-1) can be preferably used. In the oxime compound, an N—O bond of oxime may form an (E) isomer, a (Z) isomer, or a mixture of an (E) isomer and a (Z) isomer.

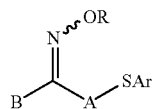

(OX-1)

In Formula (OX-1), R and B each independently represent a monovalent substituent, A represents a divalent organic group, and Ar represents an aryl group. The details of Formula (OX-1) can be found in paragraphs "0276" to "0304" of JP2013-029760A, the content of which is incorporated herein by reference.

An oxime compound having a fluorene ring can also be used as the photopolymerization initiator. Specific examples of the oxime compound having a fluorene ring include a compound described in JP2014-137466A. The content is incorporated herein by reference.

As the photopolymerization initiator, an oxime compound having a fluorine atom can also be used. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

As the photopolymerization initiator, an oxime compound having a nitro group can also be used. It is preferable that the oxime compound having a nitro group is a dimer. Specific examples of the oxime compound having a nitro group include a compound described in paragraphs "0031" to "0047" of JP2013-114249A, paragraphs "0008" to "0012" and "0070" to "0079" of JP2014-137466A, and paragraphs "0007" to "0025" of JP4223071B, and ADEKA ARKLS NCI-831 (manufactured by Adeka Corporation).

Hereinafter, specific preferable examples of the oxime compound will be shown, but the present invention is not limited thereto.

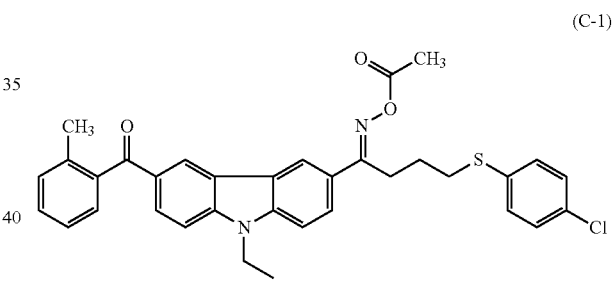

(C-1)

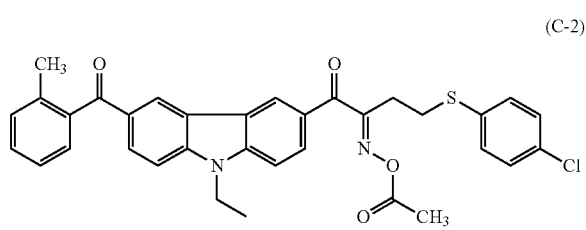

(C-2)

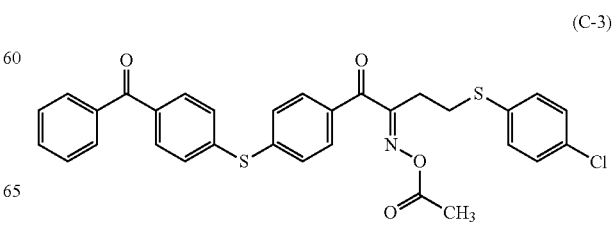

(C-3)

(C-4)
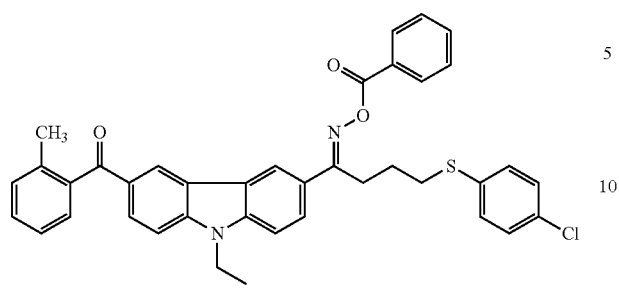
(C-5)
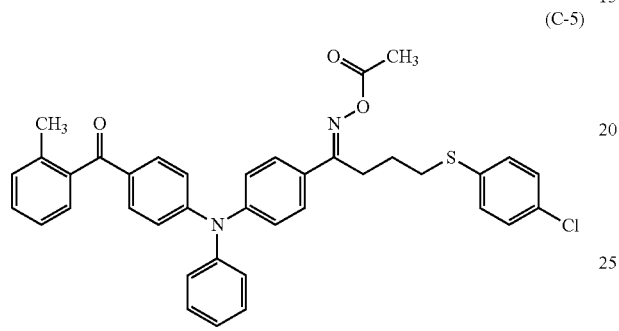
(C-6)
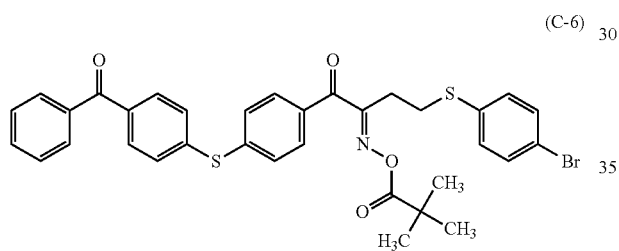
(C-7)
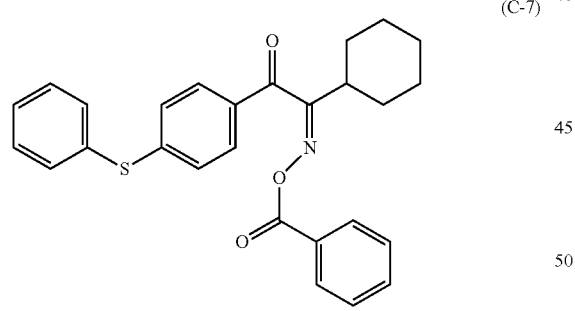
(C-8)
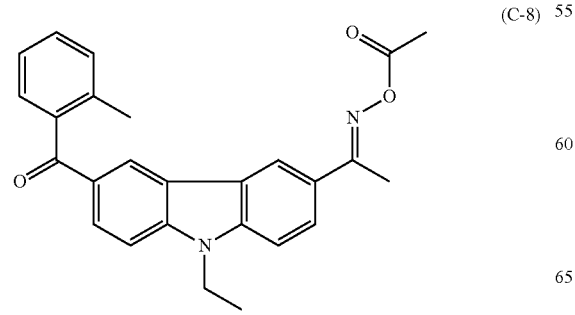
(C-9)
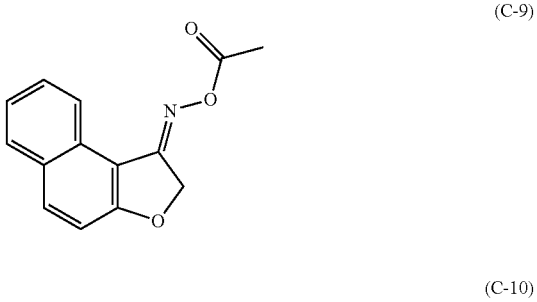
(C-10)
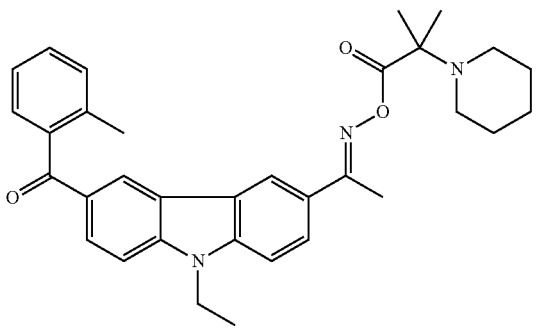
(C-11)
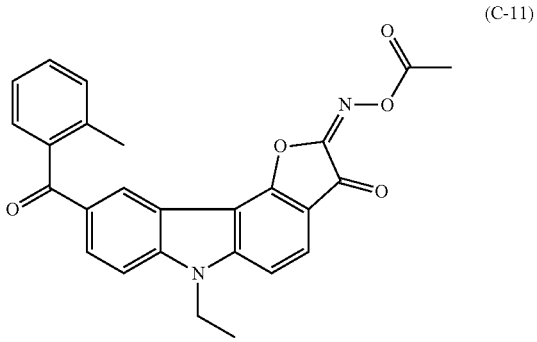
(C-12)
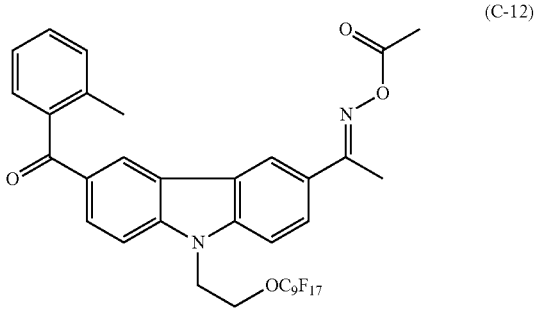
(C-13)
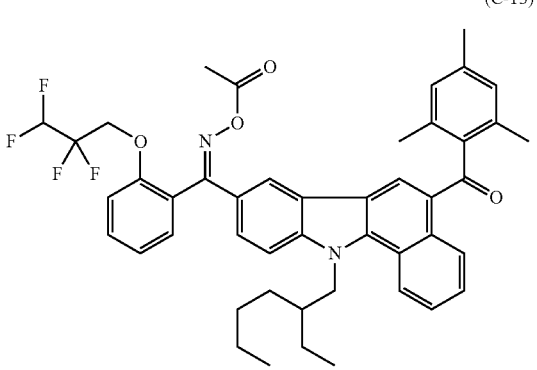

-continued (C-14)

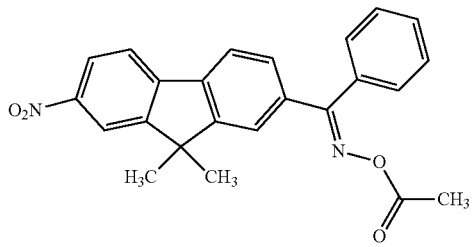

The oxime compound is preferably a compound having an absorption maximum in a wavelength range of 350 nm to 500 nm and more preferably a compound having an absorption maximum in a wavelength range of 360 nm to 480 nm. The oxime compound is preferably a compound having a high absorbance at 365 nm and 405 nm.

The molar absorption coefficient of the oxime compound at 365 nm or 405 nm is preferably 1000 to 300000, more preferably 2000 to 300000, and still more preferably 5000 to 200000 from the viewpoint of sensitivity.

The molar absorption coefficient of the compound can be measured using a well-known method. For example, it is preferable that the molar absorption coefficient can be measured using an ultraviolet-visible spectrophotometer (Cary-5 spectrophotometer, manufactured by Varian Medical Systems, Inc.) and ethyl acetate as a solvent at a concentration of 0.01 g/L.

It is preferable that the photopolymerization initiator includes an oxime compound and an α-aminoketone compound. By using the oxime compound and the α-aminoketone compound in combination, the developability is improved, and a pattern having excellent rectangularity is likely to be formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photopolymerization initiator is preferably 0.1 to 50 mass %, more preferably 0.5 to 30 mass %, and still more preferably 1 to 20 mass % with respect to the total solid content of the composition. In a case where the content of the photopolymerization initiator is in the above-described range, higher sensitivity and pattern formability can be obtained. The composition according to the embodiment of the present invention may include one photopolymerization initiator or two or more photopolymerization initiators. In a case where the composition includes two or more photopolymerization initiators, it is preferable that the total content of the photopolymerization initiators is in the above-described range.

<<Epoxy Curing Agent>>

In a case where the composition according to the embodiment of the present invention includes the compound having an epoxy group, it is preferable that the composition further includes an epoxy curing agent. Examples of the epoxy curing agent include an amine compound, an acid anhydride compound, an amide compound, a phenol compound, a polycarboxylic acid, and a thiol compound. From the viewpoints of heat resistance and transparency of a cured product, as the epoxy curing agent, a polycarboxylic acid is preferable, and a compound having two or more carboxylic anhydride groups in a molecule is more preferable. Specific examples of the epoxy curing agent include butanedioic acid. As the epoxy curing agent, a compound described in paragraphs "0072" to "0078" of JP2016-075720A can also be used, the content of which is incorporated herein by reference.

The content of the epoxy curing agent is preferably 0.01 to 20 parts by mass, more preferably 0.01 to 10 parts by mass, and still more preferably 0.1 to 6.0 parts by mass with respect to 100 parts by mass of the compound having an epoxy group.

<<Polymerization Inhibitor>>

The composition according to the embodiment of the present invention may include a polymerization inhibitor. Examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine salt (for example, an ammonium salt or a cerium (III) salt). Among these, p-methoxyphenol is preferable. The content of the polymerization inhibitor is preferably 0.01 to 5 mass % with respect to the total solid content of the composition.

<<Ultraviolet Absorber>>

The composition according to the embodiment of the present invention may include an ultraviolet absorber. As the ultraviolet absorber, a conjugated diene compound, an amino diene compound, a salicylate compound, a benzophenone compound, a benzotriazole compound, an acrylonitrile compound, or a hydroxyphenyltriazine compound can be used. The details can be found in paragraphs "0052" to "0072" of JP2012-208374A and paragraphs "0317" to "0334" of JP2013-068814A, the contents of which are incorporated herein by reference. Examples of a commercially available product of the conjugated diene compound include UV-503 (manufactured by Daito Chemical Co., Ltd.). As the benzotriazole compound, MYUA series (manufactured by Miyoshi Oil&Fat Co., Ltd.; The Chemical Daily, Feb. 1, 2016) may be used.

The content of the ultraviolet absorber is preferably 0.01 to 10 mass % and more preferably 0.01 to 5 mass % with respect to the total solid content of the composition according to the embodiment of the present invention.

<<Silane Coupling Agent>>

The composition according to the embodiment of the present invention may include a silane coupling agent. In this specification, the silane coupling agent refers to a different component from the curable compound. In this specification, the silane coupling agent refers to a silane compound having a functional group other than a hydrolyzable group. The hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. It is preferable that the functional group other than a hydrolyzable group is a group which interacts with the resin or forms a bond with the resin to exhibit affinity. Examples of the functional group other than a hydrolyzable group include a vinyl group, a styryl group, a (meth)acryloyl group, a mercapto group, an epoxy group, an oxetanyl group, an amino group, an ureido group, a sulfide group, an isocyanate group, and a phenyl group. Among these, a (meth)acryloyl group or an epoxy group is preferable. Examples of the silane coupling agent include a compound described in paragraphs "0018" to "0036" of JP2009-288703A and a compound described in paragraphs "0056" to "0066" of JP2009-242604A, the content of which is incorporated herein by reference.

The content of the silane coupling agent is preferably 0.01 to 15.0 mass % and more preferably 0.05 to 10.0 mass % with respect to the total solid content of the composition. As the silane coupling agent, one kind may be used alone, or two or more kinds may be used. In a case where two or more silane coupling agents are used in combination, it is preferable that the total content of the two or more silane coupling agents is in the above-described range.

<<Other Components>>

Optionally, the composition according to the embodiment of the present invention may further include a sensitizer, a curing accelerator, a filler, a thermal curing accelerator, a thermal polymerization inhibitor, a plasticizer, an adhesion accelerator, and other auxiliary agents (for example, conductive particles, an antifoaming agent, a flame retardant, a leveling agent, a peeling accelerator, an antioxidant, an aromatic chemical, a surface tension adjuster, or a chain transfer agent). The details of these components can be found in paragraphs "0101" to "0104" and "0107" to "0109" of JP2008-250074A, the content of which is incorporated herein by reference. Examples of the antioxidant include a phenol compound, a phosphite compound, and a thioether compound. As the antioxidant, a phenol compound having a molecular weight of 500 or higher, a phosphite compound having a molecular weight of 500 or higher, or a thioether compound having a molecular weight of 500 or higher is more preferable. Among these compounds, a mixture of two or more kinds may be used. As the phenol compound, any phenol compound which is known as a phenol antioxidant can be used. As the phenol compound, for example, a hindered phenol compound is preferable. In particular, a compound having a substituent at a position (ortho-position) adjacent to a phenolic hydroxyl group is preferable. As the substituent, a substituted or unsubstituted alkyl group having 1 to 22 carbon atoms is preferable, and a methyl group, an ethyl group, a propionyl group, an isopropionyl group, a butyl group, an isobutyl group, a t-butyl group, a pentyl group, an isopentyl group, a t-pentyl group, a hexyl group, an octyl group, an isooctyl group, or a 2-ethylhexyl group is more preferable. As the antioxidant, a compound having a phenol group and a phosphite group in the same molecule is also preferable. As the antioxidant, a phosphorus antioxidant can also be preferably used. Examples of the phosphorus antioxidant include at least one compound selected from the group consisting of tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-t-butyldibenzo[d,f][1,3,2]dioxaphosphepin-2-yl)oxy]ethyl]amine, and ethyl bis(2,4-di-t-butyl-6-methylphenyl)phosphite. These antioxidants are available as a commercially available product. Examples of the commercially available product include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation). The content of the antioxidant is preferably 0.01 to 20 mass % and more preferably 0.3 to 15 mass % with respect to the total solid content of the composition. As the antioxidant, one kind may be used alone, or two or more kinds may be used. In a case where two or more antioxidants are used in combination, it is preferable that the total content of the two or more antioxidants is in the above-described range.

For example, in a case where a film is formed by coating, the viscosity (23° C.) of the composition according to the embodiment of the present invention is preferably in a range of 1 to 3000 mPa·s. The lower limit is more preferably 3 mPa·s or higher and still more preferably 5 mPa·s or higher. The upper limit is more preferably 2000 mPa·s or lower and still more preferably 1000 mPa·s or lower.

The composition according to the embodiment of the present invention can be preferably used for forming a near infrared cut filter, an infrared transmitting filter, or the like.

<Method of Preparing Composition>

The composition according to the embodiment of the present invention can be prepared by mixing the above-described components with each other.

During the preparation of the composition, the respective components may be mixed with each other collectively, or may be mixed with each other sequentially after dissolved and dispersed in a solvent. During mixing, the order of addition or working conditions are not particularly limited. For example, all the components may be dissolved or dispersed in a solvent at the same time to prepare the composition. Optionally, two or more solutions or dispersions in which the respective components are appropriately mixed may be prepared, and the solutions or dispersions may be mixed with each other during use (during application) to prepare the composition.

In a case where the composition according to the embodiment of the present invention includes particles of a pigment or the like, it is preferable that a method of preparing the composition includes a process of dispersing the particles. Examples of a mechanical force used for dispersing the particles in the process of dispersing the particles include compression, squeezing, impact, shearing, and cavitation. Specific examples of the process include a beads mill, a sand mill, a roll mill, a ball mill, a paint shaker, a Microfluidizer, a high-speed impeller, a sand grinder, a project mixer, high-pressure wet atomization, and ultrasonic dispersion. During the pulverization of the particles using a sand mill (beads mill), it is preferable that the process is performed under conditions for increasing the pulverization efficiency, for example, by using beads having a small size and increasing the filling rate of the beads. It is preferable that rough particles are removed by filtering, centrifugal separation, and the like after the pulverization. As the process and the disperser for dispersing the particles, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be suitably used. In the process of dispersing the particles, particles may be refined in a salt milling step. A material, a device, process conditions, and the like used in the salt milling step can be found in, for example, JP2015-194521A and JP2012-046629A.

During the preparation of the composition, it is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 μm and is preferably about 0.01 to 3.0 μm and more preferably about 0.05 to 0.5 μm. In a case where the pore size of the filter is in the above-described range, fine foreign matter can be reliably removed. It is preferable that a fibrous filter material is used. Examples of the fibrous filter material include polypropylene fiber, nylon fiber, and glass fiber. Specific examples include a filter cartridge of SBP type series (for example, SBP008), TPR type series (for example, TPR002 or TPR005), and SHPX type series (for example, SHPX003) all of which are manufactured by Roki Techno Co., Ltd.

In a case where a filter is used, a combination of different filters (for example, a first filter and a second filter) may be used. At this time, the filtering using each of the filters may be performed once, or twice or more.

A combination of filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd. (former Mykrolis Corporation), or Kits Microfilter Corporation.

The second filter may be formed of the same material as that of the first filter.

The filtering using the first filter may be performed only on the dispersion, and the filtering using the second filter may be performed on a mixture of the dispersion and other components.

<Film>

A film formed of the composition according to the embodiment of the present invention can be preferably used as a near infrared cut filter. The film can also be used as a heat ray shielding filter or an infrared transmitting filter. The film formed of the composition according to the embodiment of the present invention may be used in a state where it is laminated on a support or may be peeled off from a support. The film may be a film having a pattern or a film (flat film) not having a pattern.

The thickness of the film can be adjusted according to the purpose. The thickness is preferably 20 μm or less, more preferably 10 μm or less, and still more preferably 5 μm or less. For example, the lower limit of the thickness is preferably 0.1 μm or more, more preferably 0.2 μm or more, and still more preferably 0.3 μm or more.

The film has an absorption maximum preferably in a wavelength range of 700 to 1000 nm, more preferably in a wavelength range of 720 to 980 nm, and more preferably in a wavelength range of 740 to 960 nm.

In a case where the film is used as a near infrared cut filter, it is preferable that the film used in the present invention satisfies at least one of the following condition (1), ..., or (4), and it is more preferable that the film used in the present invention satisfies all the following conditions (1) to (4).

(1) A transmittance at a wavelength of 400 nm is preferably 70% or higher, more preferably 80% or higher, still more preferably 85% or higher, and even still more preferably 90% or higher (2) A transmittance at a wavelength of 500 nm is preferably 70% or higher, more preferably 80% or higher, still more preferably 90% or higher, and even still more preferably 95% or higher (3) A transmittance at a wavelength of 600 nm is preferably 70% or higher, more preferably 80% or higher, still more preferably 90% or higher, and even still more preferably 95% or higher (4) A transmittance at a wavelength of 650 nm is preferably 70% or higher, more preferably 80% or higher, still more preferably 90% or higher, and even still more preferably 95% or higher The film used in the present invention can be used in combination with a color filter that includes a chromatic colorant. The color filter can be manufactured using a coloring composition including a chromatic colorant. Examples of the chromatic colorant include the chromatic colorants described regarding the composition according to the embodiment of the present invention. The coloring composition may further include, for example, a resin, a polymerizable compound, a photopolymerization initiator, a surfactant, a solvent, a polymerization inhibitor, and an ultraviolet absorber. In more detail, for example, the materials described above regarding the composition according to the embodiment of the present invention can be used.

In a case where the film used in the present invention is used in combination of a color filter, a laminate in which the film and the color filter are laminated can be used. In the laminate, the film used in the present invention and the color filter may be or may not be adjacent to each other in the thickness direction. In a case where the film used in the present invention is not adjacent to the color filter in the thickness direction, the film used in the present invention may be formed on another support other than a support on which the color filter is formed, or another member (for example, a microlens or a planarizing layer) constituting a solid image pickup element may be interposed between the film used in the present invention and the color filter.

In this specification, "near infrared cut filter" refers to a filter that allows transmission of light (visible light) in a visible range and shields at least a part of light (near infrared light) in a near infrared range. The near infrared cut filter may be a filter that allows transmission of light in the entire wavelength range of a visible range, or may be a filter that allows transmission of light in a specific wavelength range of a visible range and shields light in another specific wavelength range of a visible range. In addition, in this specification, a color filter refers to a filter that allows transmission of light in a specific wavelength range of a visible range and shields light in another specific wavelength range of a visible range. In this specification, "infrared transmitting filter" refers to a filter that shields visible light and allows transmission of at least a part of near infrared light.

The film used in the present invention can be used in various devices including a solid image pickup element such as a charge coupled device (CCD) or a complementary metal-oxide semiconductor (CMOS), an infrared sensor, or an image display device.

<Film Forming Method>

Next, a film forming method according to the embodiment of the present invention will be described. The film forming method according to the embodiment of the present invention includes a step of applying the composition according to the embodiment of the present invention.

In the film forming method according to the embodiment of the present invention, it is preferable that the composition is applied to a support. Examples of the support include a substrate formed of a material such as silicon, non-alkali glass, soda glass, PYREX (registered trade name) glass, or quartz glass. A charge coupled device (CCD), a complementary metal-oxide semiconductor (CMOS), a transparent conductive film, or the like may be formed on the support. A black matrix that separates pixels from each other may be formed on the support. Optionally, an undercoat layer may be provided on the support to improve adhesiveness with a layer above the support, to prevent diffusion of materials, or to make a surface of the substrate flat.

As a method of applying the composition, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet—Infinite Possibilities in Patent—" (February, 2005, S.B. Research Co., Ltd.) and methods described in JP2003-262716A, JP2003-185831A, JP2003-261827A, JP2012-126830A, and JP2006-169325A.

During application of the composition, humidity conditions are not particularly limited. According to the present invention, even in a case where the composition is applied under different humidity conditions, a film having a suppressed variation in spectral characteristics in a near infrared range can be formed. For example, the composition can be applied in a relative humidity range of 35% to 55%.

A composition layer formed by applying the composition may be dried (pre-baked). In a case where a pattern is formed through a low-temperature process, pre-baking is not necessarily performed. In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. By setting the pre-baking temperature to be 150° C. or lower, the characteristics can be effectively maintained, for example, even in a case where a photoelectric conversion film of an image sensor is formed of an organic material.

The pre-baking time is preferably 10 to 3000 seconds, more preferably 40 to 2500 seconds, and still more preferably 80 to 220 seconds. Drying can be performed using a hot plate, an oven, or the like.

The film forming method according to the embodiment of the present invention may further include a step of forming a pattern. Examples of the pattern forming method include a pattern forming method using photolithography and a pattern forming method using a dry etching method. In a case where a film formed using the film forming method according to the embodiment of the present invention is used as a flat film, the step of forming a pattern is not necessarily performed. Hereinafter, the step of forming a pattern will be described in detail.

(Case where Pattern is Formed Using Photolithography)

It is preferable that the pattern forming method using photolithography includes: a step (exposure step) of exposing the composition layer, which is formed by applying the composition according to the embodiment of the present invention, in a pattern shape; and a step (development step) of forming a pattern by removing a non-exposed portion of the composition layer by development. Optionally, the pattern forming method may further include a step (post-baking step) of baking the developed pattern. Hereinafter, the respective steps will be described.

<<Exposure Step>>

In the exposure step, the composition layer is exposed in a pattern shape. For example, the composition layer can be exposed in a pattern shape using an exposure device such as a stepper through a mask having a predetermined mask pattern. As a result, an exposed portion can be cured. As radiation (light) used during the exposure, ultraviolet rays such as g-rays or i-rays are preferable, and i-rays are more preferable. The irradiation dose (exposure dose) is preferably 0.03 to 2.5 J/cm$^2$, more preferably 0.05 to 1.0 J/cm$^2$, and still more preferably 0.08 to 0.5 J/cm$^2$. The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). The exposure illuminance can be appropriately set and typically can be selected in a range of 1000 W/m$^2$ to 100000 W/m$^2$ (for example, 5000 W/m$^2$, 15000 W/m$^2$, or 35000 W/m$^2$). Conditions of the oxygen concentration and conditions of the exposure illuminance may be appropriately combined. For example, conditions are oxygen concentration: 10 vol % and illuminance: 10000 W/m$^2$, or oxygen concentration: 35 vol % and illuminance: 20000 W/m$^2$.

<<Development Step>>

Next, a pattern is formed by removing a non-exposed portion of the exposed composition layer by development. The non-exposed portion of the composition layer can be removed by development using a developer. As a result, a non-exposed portion of the composition layer in the exposure step is eluted into the developer, and only the photo-cured portion remains on the support. As the developer, an alkali developer which does not cause damages to a solid image pickup element as a substrate, a circuit or the like is desired. For example, the temperature of the developer is preferably 20° C. to 30° C. The development time is preferably 20 to 180 seconds. In order to further improve residue removing properties, a step of shaking the developer off per 60 seconds and supplying a new developer may be repeated multiple times.

Examples of the alkaline agent used as the developer include: an organic alkaline compound such as ammonia water, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, benzyltrimethylammonium hydroxide, dimethyl bis(2-hydroxyethyl)ammonium hydroxide, choline, pyrrole, piperidine, or 1,8-diazabicyclo [5.4.0]-7-undecene; and an inorganic alkaline compound such as sodium hydroxide, potassium hydroxide, sodium carbonate, sodium bicarbonate, sodium silicate, or sodium metasilicate. As the developer, an alkaline aqueous solution in which the above alkaline agent is diluted with pure water is preferably used. A concentration of the alkaline agent in the alkaline aqueous solution is preferably 0.001 to 10 mass % and more preferably 0.01 to 1 mass %. A surfactant may be used as the developer. Examples of the surfactant include the surfactants described above regarding the composition. Among these, a nonionic surfactant is preferable. In a case where a developer including the alkaline aqueous solution is used, it is preferable that the layer is rinsed with pure water after development.

After the development, the film can also be dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and even still more preferably 90° C. or lower. The lower limit is, for example, 50° C. or higher. The film after the development is post-baked continuously or batchwise using heating means such as a hot plate, a convection oven (hot air circulation dryer), or a high-frequency heater under the above-described conditions. In a case where a pattern is formed through a low-temperature process, post-baking is not necessarily performed.

(Case where Pattern is Formed Using Dry Etching Method)

The pattern formation using the dry etching method can be performed by curing the composition layer, which is formed by applying the composition to the support or the like, to form a cured composition layer, and then etching the obtained cured composition layer with etching gas by using a patterned photoresist layer as a mask. It is preferable that pre-baking is further performed in order to form the photoresist layer. In particular, in a preferable aspect, as a process of forming the photoresist, baking after exposure or baking after development (post-baking) is performed. The details of the pattern formation using the dry etching method can be found in paragraphs "0010" to "0067" of JP2013-064993A, the content of which is incorporated herein by reference.

<Method of Manufacturing Near Infrared Cut Filter>

In addition, a method of manufacturing a near infrared cut filter according to the embodiment of the present invention will be described. The method of manufacturing a near infrared cut filter according to the embodiment of the present invention includes the film forming method according to the embodiment of the present invention. The details of the method of manufacturing a near infrared cut filter that is obtained using the manufacturing method according to the embodiment of the present invention can be found in the description of the film forming method according to the embodiment of the present invention described above.

The near infrared cut filter used in the present invention may further include, for example, a layer containing copper, a dielectric multi-layer film, or an ultraviolet absorbing layer in addition to the film that is formed using the composition according to the embodiment of the present invention. By further including the layer containing copper and/or the dielectric multi-layer film, the near infrared cut filter having a viewing angle and excellent infrared shielding properties can be easily obtained. By including the ultraviolet absorbing layer, the near infrared cut filter having excellent ultraviolet shielding properties can be obtained. The details of the ultraviolet absorbing layer can be found in the description of an absorbing layer described in paragraphs "0040" to "0070" and paragraphs "0119" to "0145" of WO2015/099060, the content of which is incorporated herein by reference. The details of the dielectric multi-layer film can be found in paragraphs "0255" to "0259" of JP2014-041318A, the content of which is incorporated herein by reference. As the layer containing copper, a glass substrate (copper-containing glass substrate) formed of glass containing copper, or a layer (copper complex-containing layer) containing a copper complex may also be used. Examples of the copper-containing glass substrate include a phosphate glass including copper and a fluorophosphate glass including copper. Examples of a commercially available product of the copper-containing glass include NF-50 (manufactured by AGC Techno Glass Co., Ltd.), BG-60 and BG-61 (both of which are manufactured by Schott AG), and CD5000 (manufactured by Hoya Corporation).

The near infrared cut filter used in the present invention can be used in various devices including a solid image pickup element such as a charge coupled device (CCD) or a complementary metal-oxide semiconductor (CMOS), an infrared sensor, or an image display device.

It is also preferable that the near infrared cut filter according to the present invention includes: a pixel (pattern) of the film that is formed using the composition according to the embodiment of the present invention; and a pixel (pattern) selected from a red pixel, a green pixel, a blue pixel, a magenta pixel, a yellow pixel, a cyan pixel, a black pixel, or an achromatic pixel.

<Method of Manufacturing Solid Image Pickup Element>

The method of manufacturing a solid image pickup element according to the embodiment of the present invention includes the film forming method according to the embodiment of the present invention. The configuration of the solid image pickup element is not particularly limited as long as it includes the film that is obtained using the composition according to the embodiment of the present invention and functions as a solid image pickup element. For example, the following configuration can be adopted.

The solid image pickup element includes a plurality of photodiodes and transfer electrodes on the support, the photodiodes constituting a light receiving area of the solid image pickup element, and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the film used in the present invention is formed on the device protective film. Further, a configuration in which light collecting means (for example, a microlens; hereinafter, the same shall be applied) is provided above the device protective film and below the film used in the present invention (on a side thereof close the support), or a configuration in which light collecting means is provided on the film used in the present invention may be adopted. In addition, the color filter may have a structure in which a cured film which forms each pixel is embedded in a space which is partitioned in, for example, a lattice shape by a partition wall. In this case, it is preferable that the partition wall has a low refractive index with respect to each pixel. Examples of an imaging device having such a structure include a device described in JP2012-227478A and JP2014-179577A.

<Method of Manufacturing Image Display Device>

A method of manufacturing an image display device according to the embodiment of the present invention includes the film forming method according to the embodiment of the present invention. Examples of the image display device include a liquid crystal display device or an organic electroluminescence (organic EL) display device. The definition and details of the image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). The details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices described in "Next-Generation Liquid Crystal Display Techniques". The image display device may include a white organic EL element. It is preferable that the white organic EL element has a tandem structure. The tandem structure of the organic EL element is described in, for example, JP2003-045676A, or pp. 326-328 of "Forefront of Organic EL Technology Development-Know-How Collection of High Brightness, High Precision, and Long Life-" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

<Method of Manufacturing Infrared Sensor>

The method of manufacturing an infrared sensor according to the embodiment of the present invention includes the film forming method according to the embodiment of the present invention. The configuration of the infrared sensor is not particularly limited as long as it includes the film used in the present invention and functions as an infrared sensor.

Hereinafter, an embodiment of the infrared sensor used in the present invention will be described using the drawings.

In FIG. 1, reference numeral 110 represents a solid image pickup element. In an imaging region provided on a solid image pickup element 110, near infrared cut filters 111 and infrared transmitting filters 114 are provided. In addition, color filters 112 are laminated on the near infrared cut filters 111. Microlenses 115 are disposed on an incidence ray hv side of the color filters 112 and the infrared transmitting filters 114. A planarizing layer 116 is formed so as to cover the microlenses 115.

The near infrared cut filters 111 are filters that allow transmission of light in a visible range and shield light in a near infrared range. Spectral characteristics of the near infrared cut filters 111 can be selected depending on the emission wavelength of an infrared light emitting diode (infrared LED) to be used. The near infrared cut filter 111 can be formed using the composition according to the embodiment of the present invention.

The color filters 112 is not particularly limited as long as pixels which allow transmission of light having a specific wavelength in a visible range and absorbs the light are formed therein, and well-known color filters of the related art for forming a pixel can be used.

For example, pixels of red (R), green (G), and blue (B) are formed in the color filters. For example, the details of the color filters can be found in paragraphs "0214" to "0263" of JP2014-043556A, the content of which is incorporated herein by reference.

Characteristics of the infrared transmitting filters 114 can be selected depending on the emission wavelength of the infrared LED to be used. For example, in a case where the emission wavelength of the infrared LED is 850 nm, a maximum value of a light transmittance of the infrared transmitting filter 114 in the thickness direction of the film in a wavelength range of 400 to 650 nm is preferably 30% or lower, more preferably 20% or lower, still more preferably 10% or lower and even still more preferably 1% or lower. It is preferable that the transmittance satisfies the above-described conditions in the entire wavelength range of 400 to 650 nm. A maximum value of a light transmittance of the film in the thickness direction in a wavelength range of 400 to 650 nm is 0.1% or higher.

A minimum value of a light transmittance of the infrared transmitting filter 114 in the thickness direction of the film in a wavelength range of 800 nm or longer (preferably 800 to 1300 nm) is preferably 70% or higher, more preferably 80% or higher, and still more preferably 90% or higher. It is preferable that the transmittance satisfies the above-described conditions in a part of a wavelength range of 800 nm or longer, and it is more preferable that the transmittance satisfies the above-described conditions at a wavelength corresponding to the emission wavelength of the infrared LED. The minimum value of the light transmittance in a wavelength range of 800 to 1300 nm is typically 99.9% or lower.

The thickness of the infrared transmitting filter 114 is preferably 100 µm or less, more preferably 15 µm or less, still more preferably 5 µm or less, and even still more preferably 1 µm or less. The lower limit value is preferably 0.1 µm. In a case where the thickness is in the above-described range, the film can satisfy the above-described spectral characteristics.

A method of measuring the spectral characteristics, the thickness, and the like of the infrared transmitting filter 114 is as follows.

The thickness of the film can be obtained by measuring the thickness of the substrate including the film using a stylus surface profilometer (DEKTAK 150, manufactured by ULVAC Inc.) after drying.

Regarding the spectral characteristics of the film, values obtained by measuring the transmittance in a wavelength range of 300 to 1300 nm using an ultraviolet-visible-near infrared spectrophotometer (U-4100, manufactured by Hitachi High-Technologies Corporation) can be used.

For example, in a case where the emission wavelength of the infrared LED is 940 nm, it is preferable that a maximum value of a light transmittance of the infrared transmitting filter 114 in a thickness direction in a wavelength range of 450 to 650 nm is 20% or lower, that a light transmittance of the infrared transmitting filter 114 in the thickness direction at a wavelength of 835 nm is 20% or lower, and that a minimum value of a light transmittance of the infrared transmitting filter 114 in the thickness direction in a wavelength range of 1000 to 1300 nm is 70% or higher.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "part(s)" and "%" represent "part(s) by mass" and "mass %". In addition, in the following structural formulae, Me represents a methyl group, Et represents an ethyl group, Bu represents a butyl group, and Ph represents a phenyl group.

<Preparation of Composition>

Raw materials shown in the following table were mixed and stirred at a ratio (part(s) by mass) shown in the following table, and the mixture was filtered through a nylon filter (manufactured by Pall Corporation) having a pore size of 0.45 μm. As a result, each composition was prepared.

TABLE 2

| | | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|---|
| Kind of Near Infrared Absorbing Compound | | A1 | A1/A2 | A3 | A4 | A5 | A5 | A4 | A4 | A4 | A6 | A7 |
| Content of Near Infrared Absorbing Compound | | 4.81 | 1.20/3.61 | 4.81 | 4.81 | 4.81 | 4.00 | 4.81 | 4.81 | 4.81 | 3.81 | 3.81 |
| Dispersion 1 | | — | — | — | — | — | 5.36 | — | — | — | — | — |
| Resin | 1 | 27.89 | 27.89 | 27.89 | 27.89 | 27.89 | 27.89 | 34.17 | 34.17 | — | — | — |
| | 2 | — | — | — | — | — | — | — | — | — | — | — |
| | 3 | — | — | — | — | — | — | — | — | — | — | — |
| | 4 | — | — | — | — | — | — | — | — | 27.89 | — | — |
| | 5 | — | — | — | — | — | — | — | — | — | 27.89 | 27.89 |
| | 6 | — | — | — | — | — | — | — | — | — | — | — |
| Polymerizable Compound | 1 | 2.00 | 2.00 | 2.00 | 2.00 | 2.00 | 2.00 | 2.00 | 2.40 | 2.00 | 2.00 | 2.00 |
| Photopolymerization Initiator | 1 | 2.17 | 2.17 | 2.17 | 2.17 | 2.17 | 2.17 | 2.17 | 2.17 | 2.17 | 2.17 | 2.17 |
| Additive | | — | — | — | — | — | — | — | — | — | 1.00 | 1.00 |
| Surfactant | | 2.28 | 2.28 | 2.28 | 2.28 | 2.28 | 2.28 | 0.39 | 0.04 | 2.28 | 2.28 | 2.28 |
| Polymerization Inhibitor | | 0.001 | 0.001 | 0.001 | 0.001 | 0.001 | 0.001 | 0.001 | 0.001 | 0.001 | 0.001 | 0.001 |
| Solvent 1 | | 57.08 | 57.08 | 57.08 | 57.08 | 57.08 | 57.08 | 55.55 | 55.51 | 57.08 | 57.08 | 57.08 |
| Solvent 2 | | 3.78 | 3.78 | 3.78 | 3.78 | 3.78 | 3.78 | 0.91 | 0.93 | 3.78 | 3.78 | 3.78 |
| Solvent 3 | | 0.00 | 0.00 | 0.00 | 0.00 | 0.00 | 0.00 | 0.00 | 0.00 | 0.00 | 0.00 | 0.00 |
| Solvent 4 | | 0.00 | 0.00 | 0.00 | 0.00 | 0.00 | 0.00 | 0.00 | 0.00 | 0.00 | 0.00 | 0.00 |
| Solvent 5 | | 0.00 | 0.00 | 0.00 | 0.00 | 0.00 | 0.00 | 0.00 | 0.00 | 0.00 | 0.00 | 0.00 |
| Solvent 6 | | 0.00 | 0.00 | 0.00 | 0.00 | 0.00 | 0.00 | 0.00 | 0.00 | 0.00 | 0.00 | 0.00 |
| Solvent 7 | | 0.00 | 0.00 | 0.00 | 0.00 | 0.00 | 0.00 | 0.00 | 0.00 | 0.00 | 0.00 | 0.00 |
| Solvent 8 | | 0.00 | 0.00 | 0.00 | 0.00 | 0.00 | 0.00 | 0.00 | 0.00 | 0.00 | 0.00 | 0.00 |
| Solvent 9 | | 0.00 | 0.00 | 0.00 | 0.00 | 0.00 | 0.00 | 0.00 | 0.00 | 0.00 | 0.00 | 0.00 |
| Solvent 10 | | 0.00 | 0.00 | 0.00 | 0.00 | 0.00 | 0.00 | 0.00 | 0.00 | 0.00 | 0.00 | 0.00 |
| Solvent 11 | | 0.00 | 0.00 | 0.00 | 0.00 | 0.00 | 0.00 | 0.00 | 0.00 | 0.00 | 0.00 | 0.00 |
| Content of Solvent B2 with respect to All Solvents | | 4.70% | 4.70% | 4.70% | 4.70% | 4.70% | 4.47% | 1.13% | 1.16% | 4.70% | 4.70% | 4.70% |

| | | Example 12 | Example 13 | Example 14 | Example 15 | Example 16 | Example 17 | Example 18 | Example 19 | Example 20 |
|---|---|---|---|---|---|---|---|---|---|---|
| Kind of Near Infrared Absorbing Compound | | A3 | A3 | A1 | A1 | A1 | A1 | A3 | A1 | A3 |
| Content of Near Infrared Absorbing Compound | | 4.81 | 4.81 | 4.81 | 4.81 | 4.81 | 4.81 | 4.81 | 4.81 | 4.81 |
| Dispersion 1 | | — | — | — | — | — | — | — | — | — |
| Resin | 1 | — | — | 27.89 | 27.89 | — | 27.89 | 27.89 | 27.89 | 27.89 |
| | 2 | 27.89 | — | — | — | — | — | — | — | — |
| | 3 | — | 27.89 | — | — | — | — | — | — | — |
| | 4 | — | — | — | — | — | — | — | — | — |
| | 5 | — | — | — | — | — | — | — | — | — |
| | 6 | — | — | — | — | 27.89 | — | — | — | — |
| Polymerizable Compound | 1 | 2.00 | 2.00 | 2.00 | 2.00 | 2.00 | 2.00 | 2.00 | 2.00 | 2.00 |
| Photopolymerization Initiator | 1 | 2.17 | 2.17 | 2.17 | 2.17 | 2.17 | 2.17 | 2.17 | 2.17 | 2.17 |
| Additive | | — | — | — | — | — | — | — | — | — |
| Surfactant | | 2.28 | 2.28 | 2.28 | 2.28 | 2.28 | 2.28 | 2.28 | 2.28 | 2.28 |
| Polymerization Inhibitor | | 0.001 | 0.001 | 0.001 | 0.001 | 0.001 | 0.001 | 0.001 | 0.001 | 0.001 |
| Solvent 1 | | 0.00 | 0.00 | 57.08 | 57.08 | 0.00 | 57.08 | 57.08 | 57.08 | 57.08 |
| Solvent 2 | | 3.78 | 3.78 | 0.00 | 0.00 | 3.78 | 0.00 | 0.00 | 0.00 | 0.00 |
| Solvent 3 | | 57.08 | 0.00 | 0.00 | 0.00 | 0.00 | 0.00 | 0.00 | 0.00 | 0.00 |
| Solvent 4 | | 0.00 | 57.08 | 0.00 | 0.00 | 0.00 | 0.00 | 0.00 | 0.00 | 0.00 |
| Solvent 5 | | 0.00 | 0.00 | 3.78 | 0.00 | 0.00 | 0.00 | 0.00 | 0.00 | 0.00 |
| Solvent 6 | | 0.00 | 0.00 | 0.00 | 3.78 | 0.00 | 0.00 | 0.00 | 0.00 | 0.00 |
| Solvent 7 | | 0.00 | 0.00 | 0.00 | 0.00 | 57.08 | 0.00 | 0.00 | 0.00 | 0.00 |
| Solvent 8 | | 0.00 | 0.00 | 0.00 | 0.00 | 0.00 | 3.78 | 0.00 | 0.00 | 0.00 |
| Solvent 9 | | 0.00 | 0.00 | 0.00 | 0.00 | 0.00 | 0.00 | 3.78 | 0.00 | 0.00 |
| Solvent 10 | | 0.00 | 0.00 | 0.00 | 0.00 | 0.00 | 0.00 | 0.00 | 3.78 | 0.00 |
| Solvent 11 | | 0.00 | 0.00 | 0.00 | 0.00 | 0.00 | 0.00 | 0.00 | 0.00 | 3.78 |
| Content of Solvent B2 with respect to All Solvents | | 4.70% | 4.70% | 4.70% | 4.70% | 4.70% | 4.70% | 4.70% | 4.70% | 4.70% |

TABLE 2-continued

|  |  | Example 21 | Example 22 | Example 23 | Example 24 | Comparative Example 1 | Comparative Example 2 | Comparative Example 3 | Comparative Example 4 |
|---|---|---|---|---|---|---|---|---|---|
| Kind of Near Infrared Absorbing Compound | | A1 | A1 | A6 | A7 | A5 | A6 | A7 | A1 |
| Content of Near Infrared Absorbing Compound | | 4.81 | 4.81 | 4.81 | 4.81 | 4.81 | 3.81 | 3.81 | 4.81 |
| Dispersion 1 | | — | — | — | — | — | — | — | — |
| Resin | 1 | 27.89 | 27.89 | 27.89 | 27.89 | 27.89 | — | — | 27.89 |
|  | 2 | — | — | — | — | — | — | — | — |
|  | 3 | — | — | — | — | — | — | — | — |
|  | 4 | — | — | — | — | — | — | — | — |
|  | 5 | — | — | — | — | — | 27.89 | 27.89 | — |
|  | 6 | — | — | — | — | — | — | — | — |
| Polymerizable Compound | 1 | 2.00 | 2.00 | 2.00 | 2.00 | 2.00 | 2.00 | 2.00 | 2.00 |
| Photopolymerization Initiator | 1 | 2.17 | 2.17 | 2.17 | 2.17 | 2.17 | 2.17 | 2.17 | 2.17 |
| Additive | | — | — | — | — | — | 1.00 | 1.00 | — |
| Surfactant | | 2.28 | 2.28 | 2.28 | 2.28 | 2.28 | 2.28 | 2.28 | 2.28 |
| Polymerization Inhibitor | | 0.001 | 0.001 | 0.001 | 0.001 | 0.001 | 0.001 | 0.001 | 0.001 |
| Solvent 1 | | 60.60 | 53.63 | 57.08 | 57.08 | 53.12 | 53.12 | 53.12 | 60.86 |
| Solvent 2 | | 0.08 | 7.23 | 0.00 | 0.00 | 7.74 | 7.74 | 7.74 | 0.00 |
| Solvent 3 | | 0.00 | 0.00 | 0.00 | 0.00 | 0.00 | 0.00 | 0.00 | 0.00 |
| Solvent 4 | | 0.00 | 0.00 | 0.00 | 0.00 | 0.00 | 0.00 | 0.00 | 0.00 |
| Solvent 5 | | 0.00 | 0.00 | 3.78 | 3.78 | 0.00 | 0.00 | 0.00 | 0.00 |
| Solvent 6 | | 0.00 | 0.00 | 0.00 | 0.00 | 0.00 | 0.00 | 0.00 | 0.00 |
| Solvent 7 | | 0.00 | 0.00 | 0.00 | 0.00 | 0.00 | 0.00 | 0.00 | 0.00 |
| Solvent 8 | | 0.00 | 0.00 | 0.00 | 0.00 | 0.00 | 0.00 | 0.00 | 0.00 |
| Solvent 9 | | 0.00 | 0.00 | 0.00 | 0.00 | 0.00 | 0.00 | 0.00 | 0.00 |
| Solvent 10 | | 0.00 | 0.00 | 0.00 | 0.00 | 0.00 | 0.00 | 0.00 | 0.00 |
| Solvent 11 | | 0.00 | 0.00 | 0.00 | 0.00 | 0.00 | 0.00 | 0.00 | 0.00 |
| Content of Solvent B2 with respect to All Solvents | | 0.10% | 9.00% | 4.70% | 4.70% | 9.63% | 9.63% | 9.63% | 0.00% |

The raw materials shown above in the table are as follows. In the table, the solvent B2 refers to a solvent in which the solubility parameter (SP value) is lower than 19.9 MPa$^{0.5}$ or a solvent in which the solubility parameter (SP value) is higher than 22.3 MPa$^{0.5}$.

(Near Infrared Absorbing Compound)

A1 to A7: compounds having the following structures.

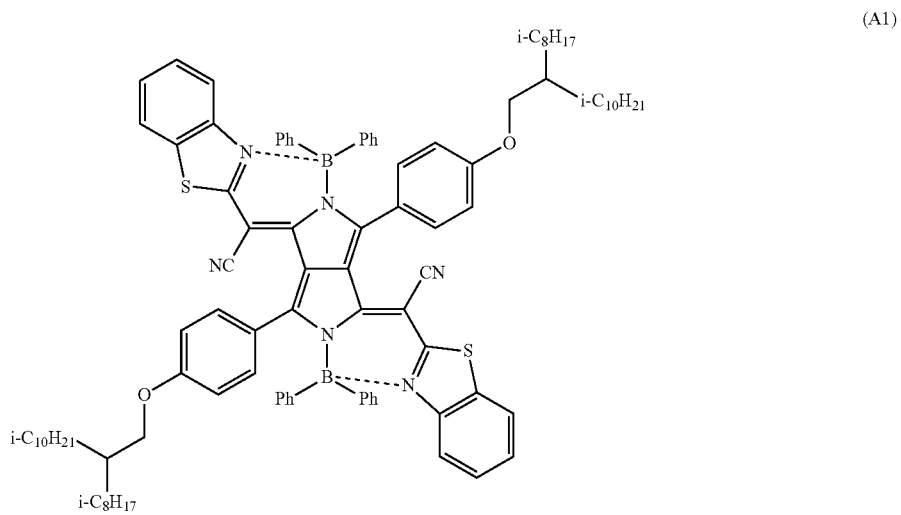

(A2)
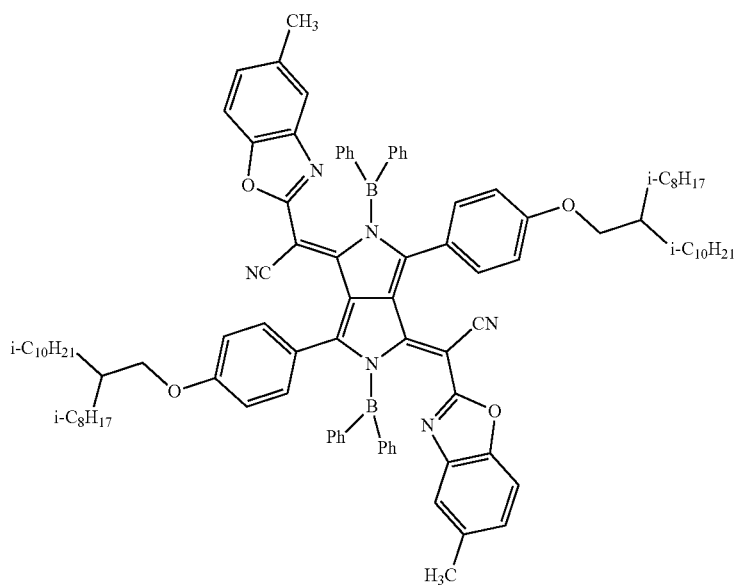
(A3)
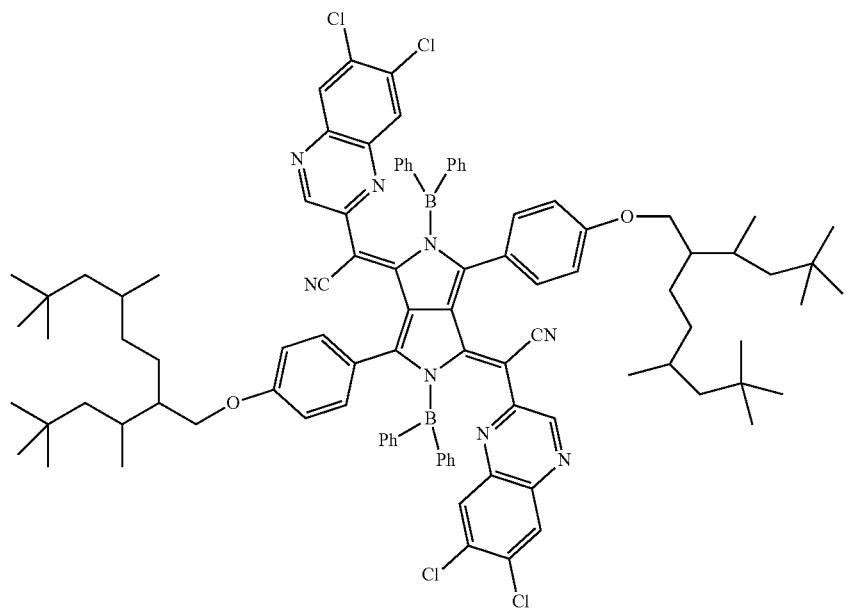

(A4)
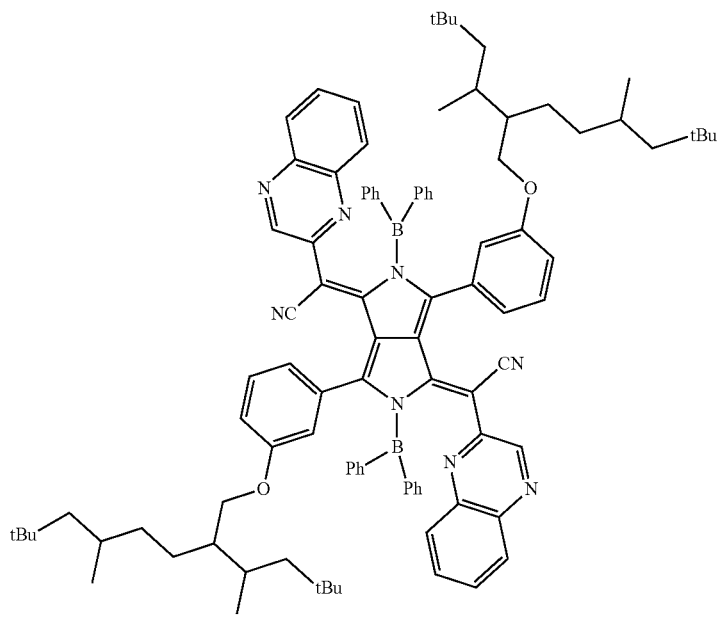
(A5)
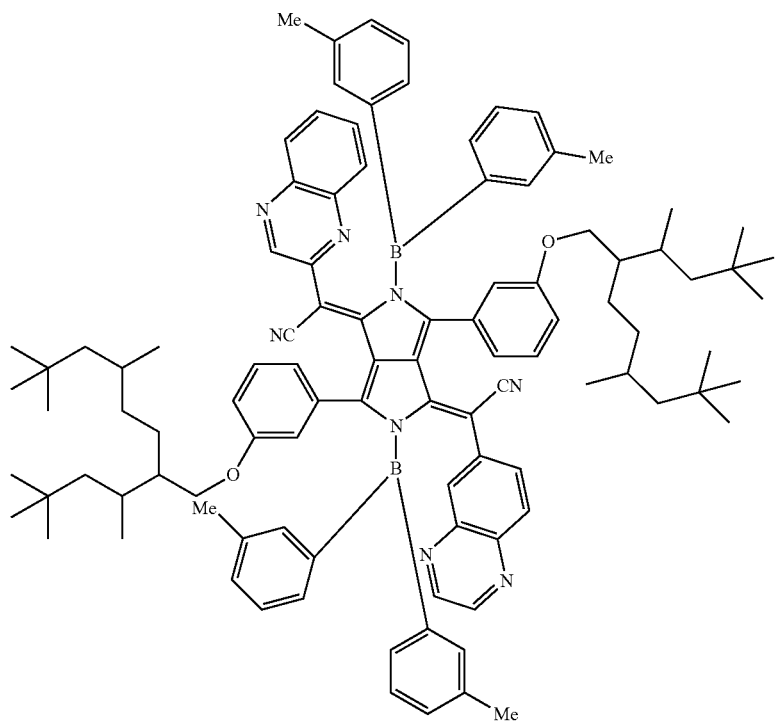
(A6)
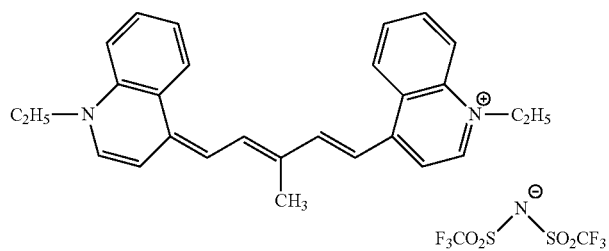

-continued (A7)

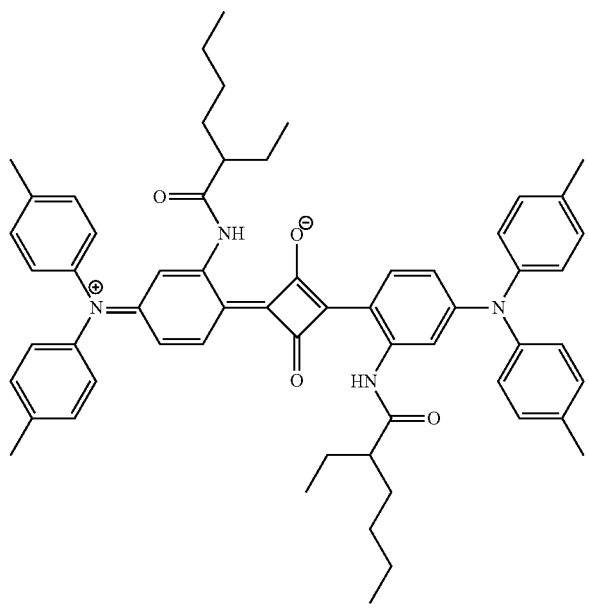

(Resin)
Resin 1: a cyclohexanone 30 mass % solution of a resin having the following structure (weight-average molecular weight: 41400; a numerical value added to a repeating unit represents a molar ratio)
Resin 2: a cyclopentanone 30 mass % solution of a resin having the following structure
Resin 3: a dipropylene glycol monomethyl ether 30 mass % solution of a resin having the following structure
Resin 4: a cyclohexanone 30 mass % solution of ARTON F4520 (manufactured by JSR Corporation)
Resin 5: a cyclohexanone 30 mass % solution of a random polymer having a glycidyl methacrylate skeleton (MARPROOF G-0150M, manufactured by NOF Corporation, weight-average molecular weight: 10000)
Resin 6: a 3-methoxybutanol 30 mass % solution of a resin having the following structure

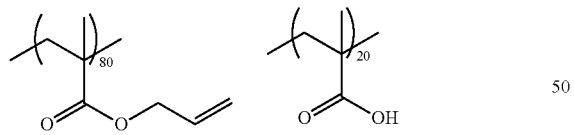

(Solvent)
Solvent 1: cyclohexanone (SP value: 20.0 MPa$^{0.5}$)
Solvent 2: propylene glycol monomethyl ether acetate (SP value: 18.2 MPa$^{0.5}$)
Solvent 3: cyclopentanone (SP value: 20.1 MPa$^{0.5}$)
Solvent 4: dipropylene glycol monomethyl ether (SP value: 20.3 MPa$^{0.5}$)
Solvent 5: methylene chloride (SP value: 19.8 MPa$^{0.5}$)
Solvent 6: propylene glycol monomethyl ether (SP value: 22.4 MPa$^{0.5}$)
Solvent 7: 3-methoxybutanol (SP value: 21.6 MPa$^{0.5}$)
Solvent 8: butyl acetate (SP value: 17.4 MPa$^{0.5}$)
Solvent 9: ethyl-3-ethoxypropionate (SP value: 18.0 MPa$^{0.5}$)
Solvent 10: N-methyl-2-pyrrolidone (SP value: 23.0 MPa$^{0.5}$)
Solvent 11: ethyl lactate (SP value: 23.3 MPa$^{0.5}$)

(Polymerizable Compound)
Polymerizable Compound 1: a mixture of the following compounds (a mixture in which a molar ratio between a left compound and a right compound is 7:3)

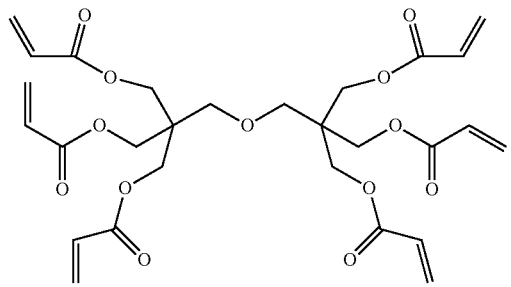

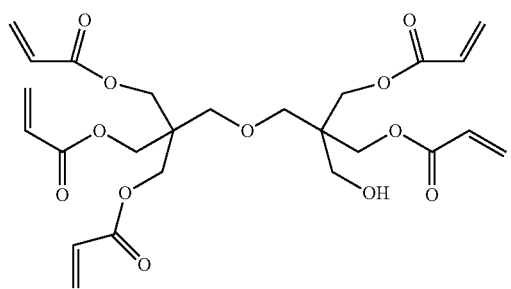

(Photopolymerization Initiator)

Photopolymerization initiator 1: a compound having the following structure

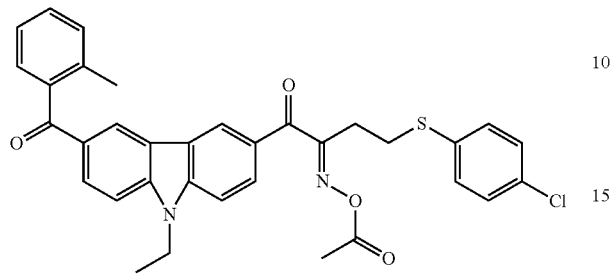

Additive: butanedioic acid

Polymerization inhibitor: p-hydroxyphenol

Surfactant: a polymer including a repeating unit represented by Formula (B1-1) and a repeating unit represented by Formula (B3-1) (weight-average molecular weight=7400 g/mol; B1-1:B3-1=92.5:7.5 (molar ratio)). In Formula (B3-1), X represents a perfluoromethylene group or a fluoroethylene group, and r represents the number of repeating units. Regarding X, a ratio —$CF_2$—$CF_2$—:—$CF_2$—:—$CH_2$—$CF_2$— between the number of —$CF_2$—$CF_2$—, the number of —$CF_2$—, and the number of —$CH_2$—$CF_2$— was 4.2:1.9:1.0.

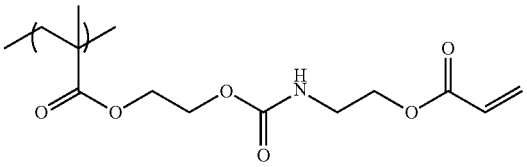

B1-1

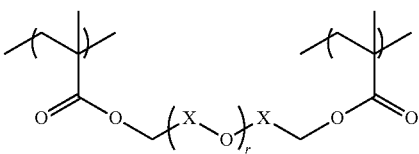

B3-1

(Dispersion 1)

Raw materials having the following composition were dispersed for 2 hours using a beads mill (a high-pressure disperser with a pressure reducing mechanism, NANO-3000-10 (manufactured by Nippon BEE Chemical Co., Ltd.)) with zirconia beads having a diameter of 0.3 mm. As a result, a dispersion 1 was prepared.

Composition of Dispersion 1

11.6 parts by mass

Near infrared absorbing compound having the following structure (average primary particle size: 200 nm)

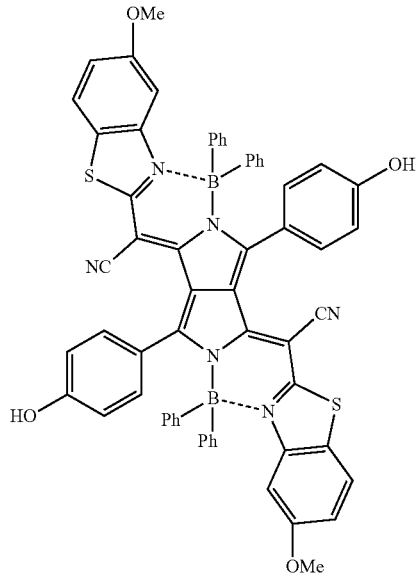

| | |
|---|---|
| Pigment derivative having the following structure | 3.5 parts by mass |

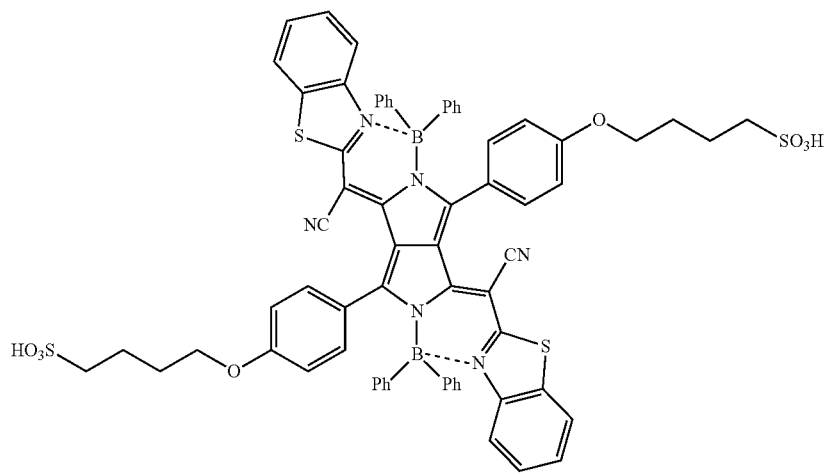

Dispersant (a resin having the following structure; weight-average molecular weight: 22900; a numerical value added to a repeating unit at a main chain represents a molar ratio, and a numerical value added to a repeating unit at a side chain represents the number of the repeating units) — 7.2 parts by mass

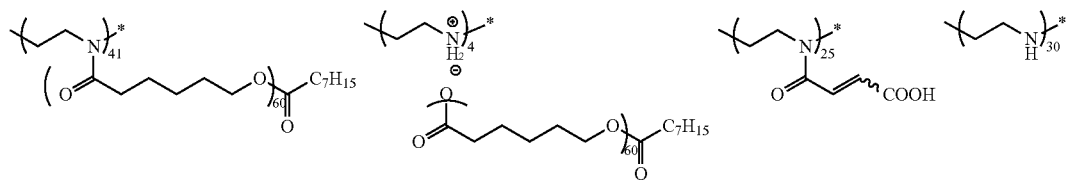

| | |
|---|---|
| Cyclohexanone | 77.77 parts by mass |

<Film Formation>

Each of the compositions was applied to a glass substrate using a spin coating method and the entire surface thereof was exposed using an i-ray stepper exposure device FPA-3000 i5+ (manufactured by Canon Corporation) at an exposure dose of 1000 mJ/cm$^2$. Next, the glass substrate was heated using a hot plate at 220° C. for 5 minutes to form a film. During the application of the composition, the relative humidity was adjusted to 30%, 40%, 50%, 60%, 70%, and 80%, and each of the compositions was applied to a glass substrate using a spin coating method under each of the humidity conditions.

[Evaluation of Humidity Dependence]

Regarding each of the films formed while changing the humidity conditions in the above-described range during application, a light transmittance in a wavelength range of 400 to 1300 nm was measured using an ultraviolet-visible-near infrared spectrophotometer U-4100 (manufactured by Hitachi High-Technologies Corporation). Regarding each of the films formed while changing the humidity conditions during application, a ratio (λx/λmax) of an absorbance λx at a wavelength at which a change in absorbance in a near infrared range (700 to 1300 nm) was large to an absorbance λmax at a wavelength at which the absorbance in a near infrared range (700 to 1300 nm) was the highest was plotted on a graph in which the horizontal axis represents a relative humidity during application and the vertical axis represents λx/λmax. A slope A when the value was linearly approximated at a relative humidity of 40% to 60% and a slope B when the value was linearly approximated at a relative humidity of 60% to 80% were calculated, and humidity dependence was evaluated using the value of A and the value of a ratio B/A of the value B to the value A. The lower the value of A and the value of B/A, the better the humidity dependence, and evaluation standards are as follows. In a case where the grade in the evaluation standards is 2 or more, there are no problems in practice.

Evaluation Standards

3: A<0.1 and (B/A)≤23
2: A<0.1 and (B/A)>23
1: A>0.1

[Evaluation of Heat Resistance]

Regarding the film formed under a condition at a relative humidity of 45% during application, a light transmittance in a wavelength range of 400 to 1300 nm was measured using an ultraviolet-visible-near infrared spectrophotometer U-4100 (manufactured by Hitachi High-Technologies Corporation). Next, the film was heated using a hot plate at 240° C. for 300 seconds. Regarding the film that was heated at 240° C. for 300 seconds, a light transmittance in a wavelength range of 400 to 1300 nm was measured, and heat resistance was evaluated based on a value at which a change in transmittance (ΔT) was the largest in the entire measurement wavelength range according to the following standards. The lower the value of ΔT, the better heat resistance.

Change (ΔT) in Transmittance=|Transmittance of Film before Heating-Transmittance of Film after Heating|

Evaluation Standards

3: ΔT %<1
2: 1≤ΔT %<5
1: 5≤ΔT %

TABLE 3

|  | Example 1 | Example 2 | Example 3 | Example 4 | Example 5 | Example 6 | Example 7 | Example 8 | Example 9 | Example 10 |
|---|---|---|---|---|---|---|---|---|---|---|
| Humidity Dependence | 3 | 3 | 3 | 3 | 3 | 3 | 2 | 2 | 3 | 3 |
| Heat Resistance | 3 | 3 | 3 | 3 | 3 | 3 | 3 | 2 | 3 | 3 |

TABLE 4

|  | Example 11 | Example 12 | Example 13 | Example 14 | Example 15 | Example 16 | Example 17 | Example 18 | Example 19 | Example 20 |
|---|---|---|---|---|---|---|---|---|---|---|
| Humidity Dependence | 3 | 3 | 3 | 2 | 2 | 2 | 2 | 3 | 2 | 2 |
| Heat Resistance | 3 | 3 | 3 | 2 | 3 | 3 | 3 | 3 | 3 | 3 |

TABLE 5

|  | Example 21 | Example 22 | Example 23 | Example 24 | Comparative Example 1 | Comparative Example 2 | Comparative Example 3 | Comparative Example 4 |
|---|---|---|---|---|---|---|---|---|
| Humidity Dependence | 2 | 2 | 3 | 3 | 1 | 1 | 1 | 3 |
| Heat Resistance | 3 | 3 | 3 | 3 | 3 | 3 | 3 | 1 |

As shown in the tables, in Examples, the humidity dependence and the heat resistance were evaluated as 2 or higher, and a film having excellent heat resistance and having a suppressed variation in spectral characteristics in a near infrared range even under different humidity conditions during application was able to be formed.

Test Example 1

The composition according to Example 3 was applied to a silicon wafer using a spin coating method such that the thickness of the formed film was 1.0 µm. Next, the silicon wafer was heated using a hot plate at 100° C. for 2 minutes. Next, using an i-ray stepper exposure device FPA-3000 i5+ (manufactured by Canon Corporation), the formed film was exposed through a mask of a 2 µm×2 µm Bayer pattern at an exposure dose of 1000 mJ/cm². Next, puddle development was performed at 23° C. for 60 seconds using a tetramethylammonium hydroxide (TMAH) 0.3 mass % aqueous solution. Next, the silicon wafer was rinsed by spin showering and was cleaned with pure water. Next, the silicon wafer was heated using a hot plate at 200° C. for 5 minutes. As a result, a 2 µm×2 µm Bayer pattern (near infrared cut filter) was formed.

Next, a Red composition was applied to the Bayer pattern of the near infrared cut filter using a spin coating method such that the thickness of the formed film was 1.0 µm. Next, the silicon wafer was heated using a hot plate at 100° C. for 2 minutes. Next, using an i-ray stepper exposure device FPA-3000 i5+(manufactured by Canon Corporation), the formed film was exposed through a mask of a 2 µm×2 µm Bayer pattern at an exposure dose of 1000 mJ/cm². Next, puddle development was performed at 23° C. for 60 seconds using a tetramethylammonium hydroxide (TMAH) 0.3 mass % aqueous solution. Next, the silicon wafer was rinsed by spin showering and was cleaned with pure water. Next, the silicon wafer was heated using a hot plate at 200° C. for 5 minutes. As a result, the Red composition was patterned on the Bayer pattern of the near infrared cut filter. Likewise, a Green composition and a Blue composition were sequentially patterned to form red, green, and blue color patterns.

Next, the composition for forming an infrared transmitting filter was applied to the pattern-formed film using a spin coating method such that the thickness of the formed film was 2.0 µm. Next, the silicon wafer was heated using a hot plate at 100° C. for 2 minutes. Next, using an i-ray stepper exposure device FPA-3000 i5+ (manufactured by Canon Corporation), the formed film was exposed through a mask of a 2 µm×2 µm Bayer pattern at an exposure dose of 1000 mJ/cm². Next, puddle development was performed at 23° C. for 60 seconds using a tetramethylammonium hydroxide (TMAH) 0.3 mass % aqueous solution. Next, the silicon wafer was rinsed by spin showering and was cleaned with pure water. Next, the silicon wafer was heated using a hot plate at 200° C. for 5 minutes. As a result, the infrared transmitting filter was patterned on a portion where the Bayer pattern of the near infrared cut filter was not formed. The obtained laminate was incorporated into a solid image pickup element using a well-known method. Regarding the obtained solid image pickup element, a subject was irradiated with light using a 940 nm infrared light emitting diode (infrared LED) as a light source in a low-illuminance environment (0.001 Lux) to acquire an image. Next, the imaging performance of the solid image pickup element was evaluated. In the evaluation of the imaging performance, the subject was able to be clearly recognized on the image. In addition, this solid image pickup element had excellent incidence angle dependence and had an infrared sensing function and a color recognition function.

The Red composition, the Green composition, the Blue composition, and the composition for forming an infrared transmitting filter used in Test Example 1 are as follows.

(Red Composition)

The following components were mixed and stirred, and the obtained mixture was filtered through a nylon filter (manufactured by Pall Corporation) having a pore size of 0.45 μm to prepare a Red composition.

| Red Pigment Dispersion | 51.7 parts by mass |
| Resin 14 (40 mass % PGMEA solution) | 0.6 parts by mass |
| Polymerizable compound 14 | 0.6 parts by mass |
| Photopolymerization Initiator 11 | 0.3 parts by mass |
| Surfactant 11 | 4.2 parts by mass |
| PGMEA (propylene glycol monomethyl ether acetate) | 42.6 parts by mass |

(Green Composition)

The following components were mixed and stirred, and the obtained mixture was filtered through a nylon filter (manufactured by Pall Corporation) having a pore size of 0.45 μm to prepare a Green composition.

| Green Pigment Dispersion | 73.7 parts by mass |
| Resin 14 (40 mass % PGMEA solution) | 0.3 parts by mass |
| Polymerizable compound 11 | 1.2 parts by mass |
| Photopolymerization Initiator 11 | 0.6 parts by mass |
| Surfactant 11 | 4.2 parts by mass |
| Ultraviolet absorber (UV-503, manufactured by Daito Chemical Co., Ltd.) | 0.5 parts by mass |
| PGMEA | 19.5 parts by mass |

(Blue Composition)

The following components were mixed and stirred, and the obtained mixture was filtered through a nylon filter (manufactured by Pall Corporation) having a pore size of 0.45 μm to prepare a Blue composition.

| Blue Pigment Dispersion | 44.9 parts by mass |
| Resin 14 (40 mass % PGMEA solution) | 2.1 parts by mass |
| Polymerizable compound 11 | 1.5 parts by mass |
| Polymerizable compound 14 | 0.7 parts by mass |
| Photopolymerization Initiator 11 | 0.8 parts by mass |
| Surfactant 11 | 4.2 parts by mass |
| PGMEA | 45.8 parts by mass |

(Composition for Forming Infrared Transmitting Filter)

The following components were mixed and stirred, and the obtained mixture was filtered through a nylon filter (manufactured by Pall Corporation) having a pore size of 0.45 μm to prepare a composition for forming an infrared transmitting filter.

| Pigment Dispersion 100 | 95.04 parts by mass |
| Polymerizable compound 16 | 1.84 parts by mass |
| Resin 14 | 1.02 parts by mass |
| Photopolymerization Initiator 11 | 0.883 parts by mass |
| Surfactant 11 | 0.04 parts by mass |
| Polymerization inhibitor (p-methoxyphenol) | 0.001 parts by mass |
| PGMEA | 1.18 parts by mass |

Raw materials used in the Red composition, the Green composition, the Blue composition, and the composition for forming an infrared transmitting filter are as follows.

Red Pigment Dispersion 9.6 parts by mass of C.I. Pigment Red 254, 4.3 parts by mass of C.I. Pigment Yellow 139, 6.8 parts by mass of a dispersant (Disperbyk-161, manufactured by BYK Chemie), and 79.3 parts by mass of PGMEA were mixed with each other to obtain a mixed solution, and this mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Red pigment dispersion was obtained.

Green Pigment Dispersion 6.4 parts by mass of C.I. Pigment Green 36, 5.3 parts by mass of C.I. Pigment Yellow 150, 5.2 parts by mass of a dispersant (Disperbyk-161, manufactured by BYK Chemie), and 83.1 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Green pigment dispersion was obtained.

Blue Pigment Dispersion 9.7 parts by mass of C.I. Pigment Blue 15:6, 2.4 parts by mass of C.I. Pigment Violet 23, 5.5 parts by mass of a dispersant (Disperbyk-161, manufactured by BYK Chemie), 82.4 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Blue pigment dispersion was obtained.

Pigment Dispersion 100

A mixed solution having the following composition was mixed and dispersed using a beads mill (a high-pressure disperser with a pressure reducing mechanism, NANO-3000-10 (manufactured by Nippon BEE Chemical Co., Ltd.)), with zirconia beads having a diameter of 0.3 mm, until an average particle size (secondary particles) of a pyrrolopyrrole pigment was 75 nm or less. As a result, a pigment dispersion was prepared. The volume average particle size of a pigment in the pigment dispersion was measured using MICROTRAC UPA 150 (manufactured by Nikkiso Co., Ltd.).

| Pyrrolopyrrole pigment (the following compound) | 2.1 parts by mass |
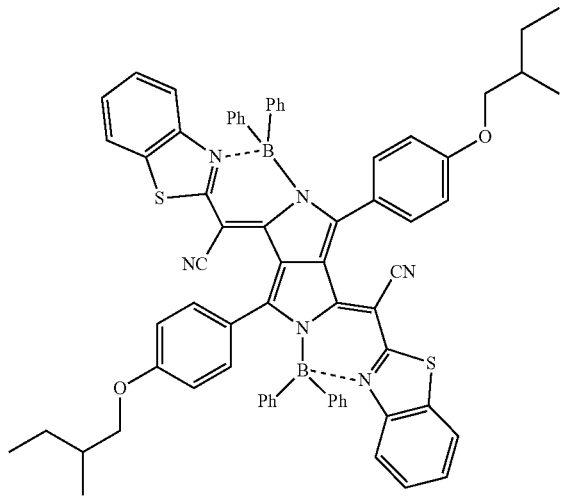
| C.I. Pigment Red 254 | 2.1 parts by mass |
| C.I. Pigment Blue 15:6 | 2.1 parts by mass |
| C.I. Pigment Yellow 139 | 1.2 parts by mass |
| Pigment derivative (the following compound) | 1.9 parts by mass |
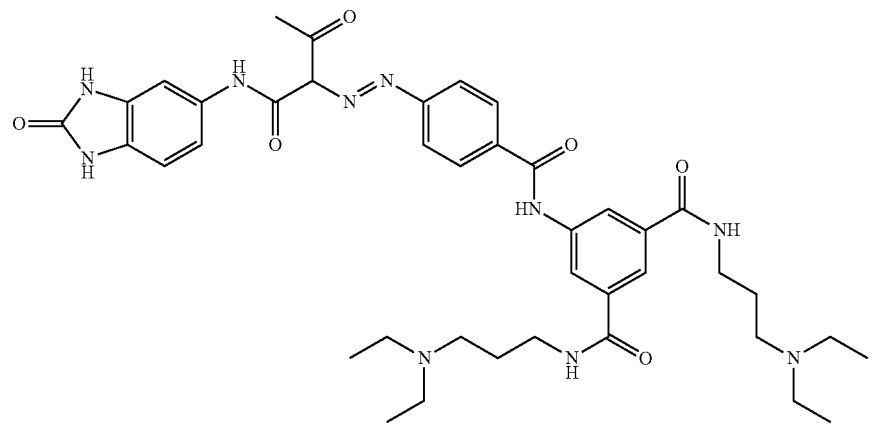 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

Resin having the following structure (weight-average molecular weight: 8500, numerical values added to a main chain represent a molar ratio, a numerical value added to a side chain represents the number of repeating units) 6.8 parts by mass

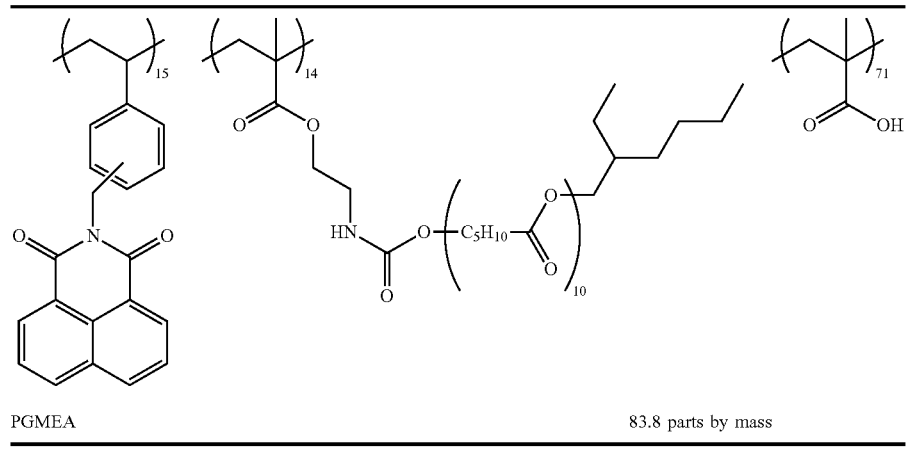

| PGMEA | 83.8 parts by mass |

Polymerizable compound 11: KAYARAD DPHA (manufactured by Nippon Kayaku Co., Ltd.)

Polymerizable Compound 14: the following structure

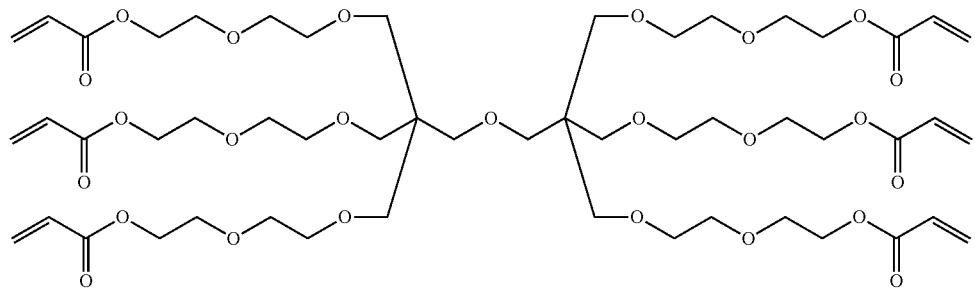 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Polymerizable compound 16: M-305 (including 55 to 63 mass % of triacrylate; manufactured by Toagosei Co., Ltd.)

Resin 14: the following structure (acid value: 70 mgKOH/g, Mw=11000; a ratio in a structural unit is a molar ratio)

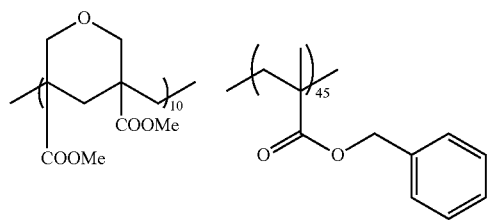

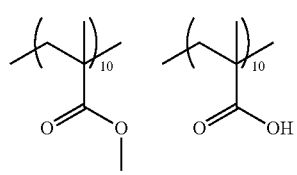

-continued

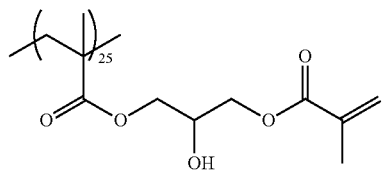

Photopolymerization Initiator 11: IRGACURE-OXE 01 (manufactured by BASF SE)

Surfactant 11: 1 mass % PGMEA solution of the following mixture (Mw: 14000). In the following formula, "%" representing the proportion of a repeating unit is mol %.

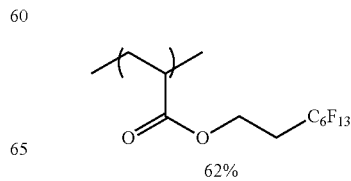

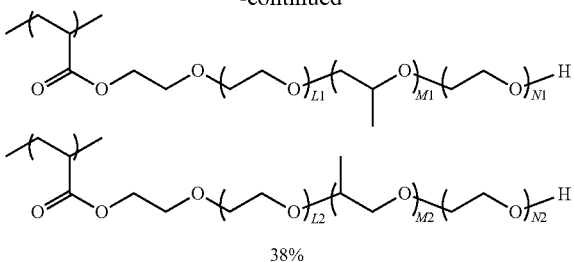

L1 + N1 = L2 + N2 = 14
M1 = M2 = 17

38%

EXPLANATION OF REFERENCES

110: solid image pickup element
111: near infrared cut filter
112: color filter
114: infrared transmitting filter
115: microlens
116: planarizing layer

What is claimed is:

1. A composition comprising:
   a near infrared absorbing compound A that includes a π-conjugated plane having a monocyclic or fused aromatic ring; and
   a solvent B,
   wherein the solvent B includes a solvent B1 in which a solubility parameter is in a range between 19.9 MPa$^{0.5}$ or higher and 22.3 MPa$^{0.5}$ or lower and a solvent B2 in which a solubility parameter is lower than 19.9 MPa$^{0.5}$ or higher than 22.3 MPa$^{0.5}$, and
   a content of the solvent B2 in the solvent B is 0.5 mass % or higher to 7.5 mass % or lower.

2. The composition according to claim 1,
   wherein the solvent B1 is at least one selected from cyclohexanone, cyclopentanone, dipropylene glycol monomethyl ether, or 3-methoxybutanol.

3. The composition according to claim 1,
   wherein the solvent B2 is at least one selected from propylene glycol monomethyl ether acetate, propylene glycol monomethyl ether, methylene chloride, ethyl-3-ethoxypropionate, N-methyl-2-pyrrolidone, butyl acetate, or ethyl lactate.

4. The composition according to claim 1, further comprising:
   a surfactant.

5. The composition according to claim 4,
   wherein the surfactant is a compound having a fluorine atom and a curable group.

6. The composition according to claim 4,
   wherein the surfactant is a compound having a fluoroether group and a curable group.

7. The composition according to claim 4,
   wherein the surfactant is a polymer that includes a repeating unit having a fluoroether group and a repeating unit having a curable group.

8. The composition according to claim 4,
   wherein a content of the surfactant is 0.1 to 12 mass % with respect to a total solid content of the composition.

9. The composition according to claim 1, further comprising:
   a resin.

10. The composition according to claim 1, further comprising:
    a polymerizable compound; and
    a photopolymerization initiator.

11. A film forming method comprising:
    applying the composition according to claim 1 to a support.

12. The film forming method according to claim 11, further comprising:
    forming a pattern.

13. A method of manufacturing a near infrared cut filter comprising:
    the film forming method according to claim 11.

14. A method of manufacturing a solid image pickup element comprising:
    the film forming method according to claim 11.

15. A method of manufacturing an image display device comprising:
    the film forming method according to claim 11.

16. A method of manufacturing an infrared sensor comprising:
    the film forming method according to claim 11.

17. The composition according to claim 1,
    wherein the solvent B1: the solvent B2 is 91.5:8.5 to 99.5:0.5 in a mass ratio.

18. The composition according to claim 1,
    wherein the solvent B1: the solvent B2 is 92.5:7.5 to 99.0:1.0 in a mass ratio.

19. The composition according to claim 1,
    wherein the near infrared absorbing compound A is at least one selected from a pyrrolopyrrole compound, a cyanine compound, or a squarylium compound.

20. The composition according to claim 1,
    wherein the near infrared absorbing compound A is a squarylium compound.

21. The composition according to claim 1,
    wherein the solvent B2 includes propylene glycol monomethyl ether or ethyl-3-ethoxypropionate.

22. A composition comprising:
    a near infrared absorbing compound A that includes a π-conjugated plane having a monocyclic or fused aromatic ring; and
    a solvent B,
    wherein the solvent B includes a solvent B1 in which a solubility parameter is in a range between 19.9 MPa$^{0.5}$ or higher and 22.3 MPa$^{0.5}$ or lower and a solvent B2 in which a solubility parameter is lower than 19.9 MPa$^{0.5}$ or higher than 22.3 MPa$^{0.5}$,
    the solvent B1 includes cyclopentanone, and
    a content of the solvent B2 is 9 mass % or lower.

* * * * *